(12) United States Patent
Matsumoto et al.

(10) Patent No.: US 8,187,664 B2
(45) Date of Patent: May 29, 2012

(54) METALLIC PATTERN FORMING METHOD, METALLIC PATTERN OBTAINED THEREBY, PRINTED WIRING BOARD USING THE SAME, AND TFT WIRING BOARD USING THE SAME

(75) Inventors: Kazuhiko Matsumoto, Minami-Ashigara (JP); Koichi Kawamura, Kanagawa (JP); Takeyoshi Kano, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 963 days.

(21) Appl. No.: 11/815,609

(22) PCT Filed: Feb. 8, 2006

(86) PCT No.: PCT/JP2006/302585
§ 371 (c)(1),
(2), (4) Date: Aug. 6, 2007

(87) PCT Pub. No.: WO2006/085669
PCT Pub. Date: Aug. 17, 2006

(65) Prior Publication Data
US 2009/0022885 A1    Jan. 22, 2009

(30) Foreign Application Priority Data

Feb. 8, 2005  (JP) .................................. 2005-032321
Feb. 17, 2005 (JP) .................................. 2005-040610

(51) Int. Cl.
*B05D 5/12* (2006.01)
(52) U.S. Cl. ....... 427/58; 427/97.9; 427/98.1; 427/98.5; 205/126; 205/231
(58) Field of Classification Search ................. 427/58, 427/97.9, 98.1, 98.5; 205/126, 231
See application file for complete search history.

(56) References Cited

U.S. PATENT DOCUMENTS

| | | | |
|---|---|---|---|
| 3,443,988 A | | 5/1969 | McCormack et al. |
| 3,853,590 A | * | 12/1974 | Kadison et al. ............... 427/437 |
| 4,021,314 A | * | 5/1977 | Dafter, Jr. ..................... 205/167 |
| 4,795,660 A | * | 1/1989 | Cooray et al. ................. 427/123 |
| 4,847,114 A | | 7/1989 | Brasch et al. |
| 4,975,327 A | * | 12/1990 | Somasiri et al. .............. 428/409 |
| 5,051,312 A | * | 9/1991 | Allmer .......................... 428/458 |
| 5,160,373 A | * | 11/1992 | Senda et al. .................. 106/1.29 |
| 5,334,488 A | * | 8/1994 | Shipley, Jr. ................... 430/315 |
| 5,389,496 A | | 2/1995 | Calvert et al. |
| 2002/0148733 A1 | * | 10/2002 | Saito et al. .................... 205/126 |
| 2003/0132121 A1 | | 7/2003 | Breen et al. |
| 2004/0126708 A1 | * | 7/2004 | Jing et al. ...................... 430/320 |
| 2004/0207081 A1 | * | 10/2004 | Wood et al. ................... 257/734 |
| 2004/0253450 A1 | * | 12/2004 | Seita et al. .................... 428/411.1 |
| 2006/0263580 A1 | * | 11/2006 | Carmichael et al. .......... 428/209 |

FOREIGN PATENT DOCUMENTS

| | | |
|---|---|---|
| EP | 1 475 230 A2 | 11/2004 |
| GB | 1 253 568 | 11/1971 |
| JP | 58-196238 A | 11/1983 |
| JP | 02-054775 A | 2/1990 |
| JP | 04-259381 A | 9/1992 |
| JP | 5-202483 A | 8/1993 |
| JP | 6-220645 A | 8/1994 |
| JP | 06-306622 A | 11/1994 |
| JP | 2000-349417 A | 12/2000 |
| JP | 2001-131761 A | 5/2001 |
| JP | 2001-168496 A | 6/2001 |
| JP | 2003-133696   * | 2/2003 |
| JP | 2003-114525 A | 4/2003 |
| JP | 2003-332738 A | 11/2003 |

OTHER PUBLICATIONS

JP Notice of Reasons for Rejection, dated Dec. 15, 2009, issued in corresponding JP Application No. 2005-032321, 4 pages in English and Japanese.
JP Notice of Reasons for Rejection, dated Dec. 15, 2009, issued in corresponding JP Application No. 2005-040610, 5 pages in English and Japanese.
Communication, dated Nov. 30, 2011, issued in corresponding EP Application No. 06713726.5, 6 pages.

* cited by examiner

*Primary Examiner* — Shamim Ahmed
(74) *Attorney, Agent, or Firm* — Sughrue Mion, PLLC

(57) ABSTRACT

The invention provides a method of forming a metallic pattern including: (a) forming, in a pattern form on a substrate, a polymer layer which contains a polymer that has a functional group that interacts with an electroless plating catalyst or a precursor thereof; (b) imparting the electroless plating catalyst or precursor thereof onto the polymer layer; and (c) forming a metallic film in the pattern form by subjecting the substrate having the polymer layer to electroless plating using an electroless plating solution, wherein the substrate is treated using a solution comprising a surface charge modifier or $1 \times 10^{-10}$ to $1 \times 10^{-4}$ mmol/l of a plating catalyst poison before or during the (c) forming of the metallic film. The invention further provides a metallic pattern obtained thereby. Furthermore, the invention provides a printed wiring board and a TFT wiring board, each of which uses the metallic pattern as a conductive layer.

18 Claims, 1 Drawing Sheet

| Depth | ORIGINAL IMAGES | IMAGES AFTER TWO COLOR GRADATION PROCESSING | RATIO OF WHITE PORTION (VOL %) |
|---|---|---|---|
| 0.3 μm | | | 53 |
| 0.2 μm | | | 60 |
| 0.1 μm | | | 60 |

METALLIC PATTERN FORMING METHOD, METALLIC PATTERN OBTAINED THEREBY, PRINTED WIRING BOARD USING THE SAME, AND TFT WIRING BOARD USING THE SAME

FIELD OF THE INVENTION

The present invention relates to a method of forming a metallic pattern and a metallic pattern obtained thereby. In particular, the present invention relates to a method of forming a metallic pattern useful as a conductive layer of a printed wiring board and a TFT wiring board and a metallic pattern obtained thereby.

BACKGROUND OF THE INVENTION

Major conventional metallic pattern forming methods conventionally-known in the art are a subtractive method, a semi-additive method, and a fully-additive method.

The subtractive method includes steps of forming a photosensitive layer sensitive to activated light irradiation over a metallic layer formed on a substrate, exposing the photosensitive layer imagewisely, forming a resist image by developing, forming a metallic pattern by etching the metal, and finally removing the resist. The substrate interface of the metal substrate used by this method has often been roughened to provide an anchoring effect for improvement in the adhesiveness between the substrate and the metallic layer. As a result, the substrate interface of the metallic pattern formed became rough, often causing a problem of deterioration in high frequency characteristics when the product is used for electric wiring. In addition, it also carried the problem of requiring a complicated step of treating the substrate with a strong acid such as chromic acid or the like, as surface roughening of the substrate is required before forming the metal substrate.

To overcome these problems, for example, a method of providing a certain degree of adhesiveness by subjecting the substrate surface to a surface grafting treatment and thus simplifying the processing steps of substrate and a method of modifying the substrate surface by grafting a radical polymerizable compound thereon, thus minimizing an unevenness of the substrate and accordingly simplifying the substrate processing step were proposed in Japanese Patent Application Laid-Open (JP-A) Nos. 58-196238, and Advanced Materials 20, pp. 1481-1494, 2000. However, an expensive apparatus such as a γ-ray generating apparatus and an electron beam generating apparatus is necessary. Further, it is predictable that a polymerization initiating group which causes graft polymerization is not introduced into the substrate, resulting in small amount of a graft polymer to be formed.

Accordingly, even if a metal substrate prepared by this method is patterned by the subtractive method, the product still contained a problem inherent to the subtractive method as follows. For forming a metallic pattern having a thinner line width by the subtractive method, so-called over-etching method, whereby the line width of a resist pattern becomes thinner after etching, is effective. However, when a fine metallic pattern is directly formed by the over-etching method, it was difficult to form a metallic pattern having a line width of 30 µm or less from the practical viewpoint of forming a favorable fine metallic pattern, due to the defects of the wire formed such as bleeding, thinning, disconnection, and the like. In addition, it also carried the problems in cost and environmental friendliness, as it demanded removal of the metallic film present in the area other than the patterned area, and it also required a significant cost for processing the metal wastewater from the etching treatment.

To overcome these problems, a new metallic pattern forming method, called semi-additive method, was proposed. The semi-additive method is a method including following steps. That is, a thin metal underlayer of Cr or the like is formed on a substrate by plating or the like, and then a resist pattern is formed on the metal underlayer. A wiring pattern is produced by forming metallic layer of Cu or the like on the region of the metal underlayer other than the resist patterned area by plating and then removing the resist pattern. A metallic pattern is subsequently formed on the region other than the resist patterned area by etching the metal underlayer while masking the wiring pattern. The method allows easier formation of a thin line pattern having a line width of 30 µm or less, as it is an etching-less process; and it is also advantageous in cost, as the metal is deposited only on the area required. However, the method demands roughening of substrate surface for improvement in the adhesiveness between the substrate and the metallic pattern, and as a result, the substrate interface of the metallic pattern formed became rough, causing a problem of deterioration in the high frequency characteristics of product when it is used for electric wiring.

Alternatively, a metallic pattern forming method called fully-additive method was also proposed. The fully-additive method is a method of forming a resist pattern on a substrate by depositing a metal on the region other than the resist pattern by plating and then removing the resist pattern. The fully-additive method allows easier formation of a thin line pattern having a line width of 30 µm or less as it is an etching-less process; and it also made the substrate interface rough in a similar manner to the semi-additive method, causing a problem of deterioration in the high frequency characteristics of product when it is used for electric wiring.

As described above, a metallic pattern forming method allowing formation of a thin line pattern, having smaller substrate interface irregularities, and producing a smaller amount of etching wastewater is yet to be proposed, and there existed a need for a new metallic pattern forming method The metallic pattern described above is useful as a wiring (conductive film) for a printed wiring board for a semiconductor device. In recent year, for electronics, there has been a high demand for processing mass storage data at high processing rate. Internal clock frequencies or external clock frequencies in a semiconductor device for processing images or controlling processing increase year by year, and the number of connecting pins also increases. In order to carry out high-speed conduction, it is important to reduce delay and damping of signals. In order to reduce propagation delay of signals, it is effective to decrease dielectric constant. In order to reduce dielectric loss, it is effective to decrease dielectric constant and dielectric tangent, respectively. However, since dielectric constant in dielectric loss is the root of dielectric constant, in actuality, dielectric tangent is largely concerned with this. For this reason, from a viewpoint of material characteristics, it is advantageous to adopt insulating materials having low dielectric tangent characteristics for carrying out high speed data processing.

Further, surface smoothing of conductive materials substantially contributes to forming materials with high density. In a conventional built-up printed wiring board, roughening treatment has been employed for obtaining stripping strength. However, status quo, irregularities of several microns interferes finer wiring.

Accordingly, from a viewpoint of forming a printed wiring board useful for a semiconductor device, means for forming very fine metallic patterns with high adhesiveness on a smooth insulating substrate.

There is a disclosed method of forming an electrically-conducting metallic pattern on a substrate with no irregularities including performing patterning by using a photosensitive silicone, imparting a catalyst, and forming a metallic pattern by plating (for example, see Japanese Patent Application Laid-Open (JP-A) No. 2000-349417). However, the silicone resin does not provide sufficient adhesion to generally-used insulating resins for printed-wiring boards such as polyimide resins and epoxy resins, and methods that can provide higher adhesion have been demanded.

Accounting for the above-described circumstances, the Applicant of the present application has proposed a method of forming a metallic pattern, which includes depositing metal particles on a fine pattern formed of a graft polymer which is directly bonded to a substrate (for example, see JP-A No. 2003-114525). According to this method, desired fine patterns can be formed depending on the accuracy of light exposure. However, there are limits to the resulting electrical conductivity of the metallic pattern formed by the deposition of metal fine particles. For applications to printed-wiring materials and the like, it has been demanded under current circumstances to further improve the electrical conductivity, for example, by a technique for increasing the thickness of the metallic layer and maintaining the accuracy of the metallic pattern in the line width direction at the same time.

SUMMARY OF THE INVENTION

The present invention, which has been made in view of the above problems with the conventional techniques, provides a method of forming a metallic pattern which enables the production of metallic fine patterns without etching process and enables the formation of metallic patterns having good adhesion to the substrate, sufficient electrical conductivity and small irregularities on the interface with the substrate. The invention further provides a metallic pattern having good electrical conductivity, good high-frequency characteristics and good adhesion to the substrate, and a printed-wiring board and a TFT wiring circuit each using the metallic pattern as an electrically-conducting layer.

The inventors have initially found that metallic fine patterns with good adhesion to the substrate can be formed by performing electroless plating on a region where a polymer having an electroless plating catalyst or a precursor thereof is directly bonded in a certain pattern to the substrate. According to the invention, while the desired line width is maintained, a metallic film is selectively grown in the thickness direction, so that a further improvement in resolution can be achieved while a certain electrical conductivity is maintained and that electrically-conducting metallic patterns of higher density can be formed.

Namely, the present invention provides a method of forming a metallic pattern comprising: (a) forming, in a pattern form on a substrate, a polymer layer which contains a polymer that has a functional group that interacts with an electroless plating catalyst or a precursor thereof and is capable of being chemically bonded directly to the substrate; (b) imparting the electroless plating catalyst or precursor thereof onto the polymer layer; and (c) forming a metallic film in the pattern form by subjecting the substrate having the polymer layer to electroless plating using an electroless plating solution, wherein the substrate having the polymer layer imparted with the electroless plating catalyst or precursor thereof is treated using a solution comprising a surface charge modifier or $1\times10^{-10}$ to $1\times10^{-4}$ mmol/l of a plating catalyst poison before or during the (c) forming of the metallic film.

In one aspect of the method of the present invention, in which the surface charge modifier is utilized, the process (c) of forming of the metallic film may include (c-1) electroless plating conducted by using the electroless plating solution which contains the surface charge modifier. Alternatively, in this aspect, the process (c) of forming of the metallic film may include (c-2) treating the substrate having the polymer layer with a bath containing the surface charge modifier; and (c-3) subjecting the substrate having the polymer layer to electroless plating so as to form the metallic film in the pattern form.

The surface charge modifier may be an organic compound having, in its molecule, (i) a group having an affinity for the substrate and (ii) an ionic leaving group.

In another aspect of the method of the present invention, in which the plating catalyst poison is utilized, the process (c) of forming of the metallic film may include (c-1') electroless plating conducted by using the electroless plating solution which contains $1\times10^{-10}$ to $1\times10^{-4}$ mmol/l of the plating catalyst poison. Alternatively, in this aspect, the process (c) of forming of the metallic film may include (c-2') subjecting the substrate having the polymer layer to electroless plating while adding the plating catalyst poison to the electroless plating solution so that a concentration of the plating catalyst poison in the electroless plating solution is maintained in a range of $1\times10^{-10}$ to $1\times10^{-4}$ mmol/l so as to form the metallic film in the pattern form.

The plating catalyst poison may be an inorganic anion selected from the group consisting of an iodine anion, a bromine anion, and a sulfide anion. The plating catalyst poison may be an organic compound having, in its molecule, a group having an affinity for a plating metal. The organic compound may further have an ionic leaving group in its molecule.

In both aspects of the method of the present invention, an electroless plating solution used in the electroless plating may be selected from the group consisting of an electroless copper plating solution, an electroless silver plating solution and an electroless gold plating solution. Further, in both aspects of the present invention, the method of the invention further may comprise carrying out electroplating after the electroless plating.

Further, in both aspects of the method of the present invention, the substrate may have a surface unevenness of 500 nm or less; an adhesiveness between the substrate and the metallic film may be 0.2 kN/m or more; and at least one of the following conditions (1) to (3) may satisfied: (1) a thickness of the metallic film is 3 μm or more; and the relation $(q-p)<r$ is satisfied, wherein p represents a line width of the pattern layer in the pattern form, q represents a line width of the metallic film formed by the electroless plating, and r represents a thickness of the metallic film formed by the electroless plating; (2) the polymer layer has a region having dispersed therein fine particles comprising at least one of electroless plating catalyst particles and metal particles deposited by the electroless plating, in a content of 25% by volume or more, the region extending 0.05 μm or more from the interface of the polymer layer and the metallic film in a direction toward the substrate; and a ratio of a thickness of the metallic film to a line width of the metallic film is 1 or more; (3) a thickness of the metallic film is 4 μm or more; the polymer layer has a region having dispersed therein fine particles comprising at least one of electroless plating catalyst particles and metal particles deposited by the electroless plating, in a content of 25% by volume or more, the region extending 0.05 μm or more from the interface of the polymer layer and the metallic film in a direction toward the substrate; and a ratio of a thickness of the metallic film to a line width of the metallic film is 1 or more.

Further, in both aspects of the method of the present invention, the substrate may have a surface unevenness of 100 nm or less.

Further, the present invention provides a metallic pattern formed by the above-described metallic pattern forming method.

Furthermore, the present invention provides a printed wiring board and a TFT wiring board, each of which has the metallic pattern as a conductive layer thereof.

Concerning the invention, the "substrate" refers to a material having a surface to which polymers can be directly and chemically bonded. In a case where a polymer is directly provided so as to be in a pattern form on a resin film, the substrate refers to the resin film itself. In a case where a polymer is provided so as to be in a pattern form on the surface of an intermediate layer such as a polymerization-initiating layer, which is formed on the surface of a base material such as a resin film, the substrate refers to the intermediate layer-carrying film base material.

In a first aspect of the metallic pattern-forming method of the invention, a surface charge modifier is allowed to coexist at a certain period in the process of performing electroless plating so that the surface charge modifier adsorbs on the surface of the substrate to inhibit the deposition of plating metal ions. Thus, the plating proceeds selectively on the surface region of the graft pattern on which the plating catalyst is present at high density. The formed metallic film is not grown in the direction of the pattern width and thus becomes to have a sufficient thickness. As a result, a metallic pattern is obtained which is very fine according to the very fine graft pattern and has high electrical conductivity.

The first aspect of the metallic pattern-forming method of the invention has an advantage in that metallic patterns having any desired thickness can be formed by further performing electroplating after the electroless plating. The adhesion of the metallic film can be further increased by conducting drying after the electroless plating or the electroplating.

In a second aspect of the metallic pattern-forming method of the invention, a specific amount of a plating catalyst poison is added to the plating bath in the process of performing electroless plating, so that a certain amount of the plating catalyst poison is bound to plating metal ions in the electroless plating bath and that the adsorption of the plating metal ions to the substrate or the plating catalyst is inhibited to a certain extent. Thus, the electroless plating proceeds selectively on the surface region of the graft pattern having a specific surface area on which the plating catalyst is present at high density. Thus, the progress of the electroless plating is effectively inhibited on the side of the graft pattern where contact with the plating catalyst poison more frequently occurs per unit area or effectively inhibited on a substrate surface that does not have the function of positively accepting the plating metal ions. Thus, the formed metallic film is not grown in the direction of the pattern width and thus becomes to have a sufficient thickness, and a metallic pattern is obtained which is very fine according to the very fine graft pattern and has high electrical conductivity.

The second aspect of the metallic pattern-forming method of the invention has an advantage in that metallic patterns having any desired thickness can be formed by further performing electroplating after the electroless plating. The adhesion of the metallic film can be further increased by conducting drying after the electroless plating or the electroplating.

In a preferable embodiment of the present invention, a substrate having a surface unevenness of 500 nm or less is used. When the condition of the substrate is satisfied, a polymer layer having a surface unevenness of 500 nm or less can be obtained when the polymer layer is formed in a pattern form. Addition of an electroless plating catalyst or a precursor thereof to the pattern and electroless plating under the coexistence of the surface charge modifier or the plating catalyst poison result in a state where the plating catalyst and plating metal are contained in the pattern (composite state) and further a metal plate layer is selectively formed in the thickness direction over the pattern so as to provide a sufficient thickness and excellent conductivity. The unevenness of the interface between the metallic pattern and the substrate thus formed, i.e. interface between the metal and the polymer layer (organic components), becomes slightly larger than that of the polymer pattern surface, because of the plating catalyst and plating metal penetrated into the polymer pattern, but the extent is so small that there is no significant influence on the high frequency characteristics of the products. Therefore, these metallic patterns have improved high frequency characteristics when used for electric wiring. High frequency characteristics are related to the transmission loss during high-frequency electric transmission and in particular to the conductor loss.

As described above, in studying details of a polymer layer (organic components) interposed between a metallic film (metallic pattern) and a substrate, the polymer layer between the substrate and the metallic film has a region having dispersed therein fine particles comprising at least one of electroless plating catalyst particles and metal particles deposited by the electroless plating, in a content of 25% by volume or more, and the region extending 0.05 μm or more from the interface of the polymer layer and the metallic film in a direction toward the substrate. It is considered that the existence of the fine particles containing therein metals or the like can form a composite state that is useful for enhancing adhesiveness of a metallic film.

Use of a substrate having a surface unevenness of 100 nm or less is preferable, as a smaller substrate surface unevenness leads to a smaller unevenness of the substrate interface of metallic pattern, which in turn leads to improvement in the high frequency characteristics of the metallic pattern obtained.

The method of the present invention can provide a metallic pattern higher in resolution than those obtained by conventional pattern-forming methods of etching by using a resist pattern because it includes selectively imparting the electroless plating catalyst or a precursor thereof to the region interactive with the electroless plating or the precursor thereof which are formed by the methods such as the above-described embodiments (1) or (2) and subsequently conducting electroless plating under the coexistence of the surface charge modifier or the plating catalyst poison. The method of the present invention is also advantageous in that there is no etching wastewater discharged.

In the invention, a surface of the substrate of the metallic pattern is formed by subjecting the substrate to a surface-grafting treatment so as to minimize irregularities of the interface of the substrate. Further, the interface of the substrate is in a hybrid state which is formed by a combination of a metallic component of the metallic film and the graft polymer directly bonded to the substrate. Accordingly, an adhesiveness between the thus formed metallic film and the substrate is considered to be high.

In the invention, Rz, that is a parameter defined by a conventionally-known profiling method relating surface textures, i.e., "difference between the average of the Z data of the highest to fifth highest peaks and the average of those of the lowest to fifth deepest bottoms on a particular surface", is used as a rough indicator of the surface unevenness.

When the metallic pattern obtained by the method according to the invention is used as a conductive material, the smaller the irregularities of the interface between the metal in a wiring region and the organic material becomes, the smaller electric loss during high-frequency electric transmission (transmission loss) becomes.

Accordingly, a printed wiring board and a TFT wiring board having a metallic pattern of the present invention obtained by using the metallic pattern as a conductive layer (wiring) thereof have a wiring which is excellent in flatness, adhesiveness to a substrate, fineness, conductivity, and high frequency characteristics.

DETAILED DESCRIPTION OF THE INVENTION

Figures 1, 2:
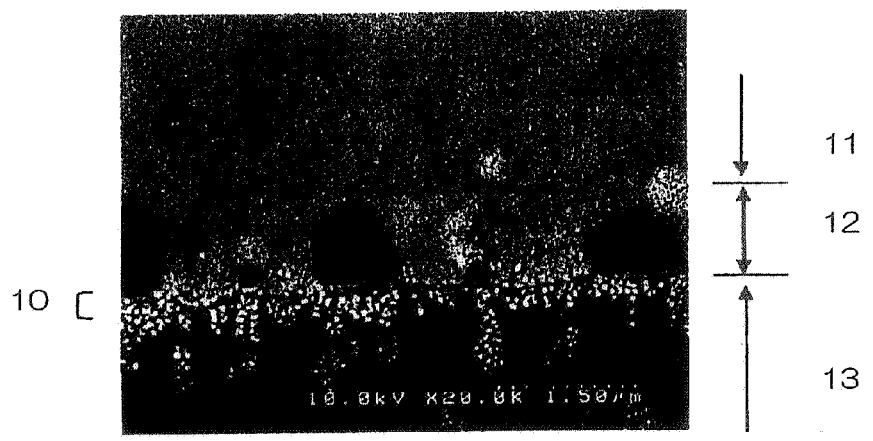
FIG. 1 is a cross-sectional photograph of SEM of a metallic pattern obtained in Example 1-3.
FIG. 2 is images obtained by image-processing the cross-sectional SEM photograph in FIG. 1 and forming two color gradations in which white indicates fine particles portions and black indicates polymer portions.

Hereinafter, the present invention will be described in detail. Firstly, the method of forming a metallic pattern of the present invention will be described.
Method of Forming Metallic Pattern The metallic pattern forming method according to the invention is a method of forming a metallic pattern comprising:

(a) forming, in a pattern form on a substrate, a polymer layer which contains a polymer that has a functional group that interacts with an electroless plating catalyst or a precursor thereof and is capable of being chemically bonded directly to the substrate;

(b) imparting the electroless plating catalyst or precursor thereof onto the polymer layer; and (c) forming a metallic film in the pattern form by subjecting the substrate having the polymer layer to electroless plating using an electroless plating solution, wherein the substrate having the polymer layer imparted with the electroless plating catalyst or precursor thereof is treated using a solution comprising a surface charge modifier or $1 \times 10^{-10}$ to $1 \times 10^{-4}$ mmol/l of a plating catalyst poison before or during the (c) forming of the metallic film.

Namely, the metallic pattern forming method according to the invention comprises forming, on a substrate, a region that interacts with an electroless plating catalyst or a precursor thereof and a region that does not interact therewith, adding an electroless plating catalyst or a precursor thereof to the interactive region, and then subjecting the substrate to electroless plating. In the invention, the region having a polymer that interacts with an electroless plating catalyst or a precursor thereof (i.e. polymer layer) will be referred to as a "graft pattern".

Hereinafter, the processes (a) to (c) will be described in that order.
(a) Forming Graft Pattern on Substrate Any of the following methods of (1) and (2) may be used as the process for the (a) forming, in a pattern form on a substrate, a polymer layer which contains a polymer that has a functional group that interacts with an electroless plating catalyst or a precursor thereof and is capable of being chemically bonded directly to the substrate.

(1) A method that includes: directly and chemically bonding a polymer compound to an entire surface of the substrate, wherein the polymer compound has a functional group that is changed by heat, acid or radiation into another functional group capable of interacting with an electroless plating catalyst or a precursor thereof or has a functional group that loses, by heat, acid or radiation, the function of interacting with an electroless plating catalyst or a precursor thereof (hereinafter, such functional groups are referred as "polarity-converting group" as needed); and then applying heat or radiation based on an image to form a patterned region capable of interacting with the electroless plating catalyst or a precursor thereof.

(2) A method that includes: bringing the surface of the substrate into contact with a compound that has a polymerizable group and a functional group capable of interacting with an electroless plating catalyst or a precursor thereof; and applying radiation based on an image to form a patterned region capable of interacting with the electroless plating catalyst or a precursor thereof.
Surface Graft Polymerization The polymer layer in the method (1) is prepared by means of so-called surface graft polymerization. Graft polymerization is a method of preparing a graft polymer by adding an active species to a polymer compound chain and allowing it to polymerize with another monomer that initiates polymerization, and in particular, when the polymer compound providing the active species is present on a solid surface, it is called surface graft polymerization.

Methods of the surface graft polymerization for realizing the embodiment include any known methods described in literature. Examples thereof include the photo-graft polymerization methods and plasma irradiation graft polymerization methods described in New Experimental Methods of Polymer 10 (Soc. Polymer Science Japan Ed., 1994, Kyoritsu Shuppan Co., Ltd., p. 135) and JP-A Nos. 63-92658, 10-296895, and 11-119413. In addition, examples thereof also include radiation graft polymerization methods of using γ ray or electron beam described in Handbook of Absorption Technology (NTS., Akira Takeuchi Ed., February 1999, p. 203 and 695), or the like.

Specific examples of the photo-graft polymerization methods include the methods described in JP-A Nos. 63-92658, 10-296895, and 11-119413.

In addition to these methods above, the methods of forming the surface graft layer to which the terminal of a polymer compound chain is chemically bonded directly include a method of introducing a reactive functional group such as trialkoxysilyl group, isocyanate group, amino group, hydroxyl group, or carboxyl group to the terminal of the polymer compound chain and causing a coupling reaction between the functional group thereof and the functional group present on substrate surface.

The substrate surface according to this embodiment is a surface whereto the terminal of a polymer compound having a polarity-transition group on the surface is chemically bonded directly or via a backbone polymer, and the base material may have such a surface property as it is, or an intermediate layer separately formed on the base material may have such a property. Such a substrate preferably has a surface unevenness of 500 nm or less.

Methods of forming a surface whereto the terminal of a polymer compound chain having a polarity-transition group is chemically bonded via a backbone polymer include the method of adding a functional group that can react with the functional group on substrate surface in a coupling reaction to the side chain of the backbone polymer, thus preparing a graft polymer compound containing the polymer compound chain having a polarity-transition group as the graft chain and allowing a coupling reaction between the polymer and the functional group on lower layer surface.

Hereinafter, the polarity-transition group used in the embodiment will be described. The polarity-transition groups according to the embodiment include a type of groups (A) that changes its polarity by heat or acid and a type of groups (B) that changes its polarity by radiation (light).

In the invention, the "functional group that interacts with an electroless plating catalyst or a precursor thereof" is not particularly limited, if the group is a functional group to which the electroless plating catalyst or precursor thereof described below can be bonded, but generally a hydrophilic group.

Functional Group (A) that Changes its Polarity by Heat or Acid

First, the functional group (A) that changes the polarity by heat or acid will be described.

The type of functional groups (A) (A) that changes its polarity by heat or acid are classified into two groups, functional groups that change the polarity from hydrophobic to hydrophilic by heat or acid and functional groups that change the polarity from hydrophilic to hydrophobic by heat or acid.

Functional Group (A-1) that Changes its Polarity from Hydrophobic to Hydrophilic by Heat or Acid The functional groups (A-1) that changes its polarity from hydrophobic to hydrophilic by heat or acid includes any known functional groups described in literature.

Hereinafter, examples of functional groups (A-1) that change the polarity from hydrophobic to hydrophilic by heat or acid and of compounds having the functional group will be described.

Examples of the functional groups include alkylsulfuric acid esters, disulfones, and sulfonimides described in JP-A No. 10-282672; alkoxyalkyl esters described in European Patent No. 0652483 and W.O. No. 92/9934; the t-butyl esters described in H. Ito et al., Macromolecules, vol. 21, pp. 1477; carboxylic acid esters protected by an acid-decomposable group such as silyl ester, vinyl ester, or the like described in literature; and the like.

The examples also include imino sulfonate groups described in Masahiro Tsunooka, "Surface" vol. 133 (1995), p. 374; β-ketone sulfonic esters described in Masahiro Kadooka, Polymer preprints, Japan, vol. 46 (1997), p. 2045; nitrobenzyl sulfonate compound described in Tuguo Yamaoka, JP-A No. 63-257750, but the invention is not limited to these functional groups.

The functional groups described in JP-A No. 2001-117223 are also favorable. Among the functional groups described in JP-A No. 2001-117223, the secondary alkylsulfuric acid ester groups represented by General Formula (1), tertiary carboxylic acid ester groups, and the alkoxyalkyl ester groups represented by general formula (2) are more preferable, and among them, the secondary alkylsulfuric acid ester groups represented by general formula (1) are particularly preferable, though the present invention is not limited thereto. Specific examples of the particularly preferable functional groups will be listed below.

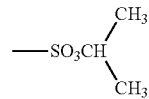
(1)

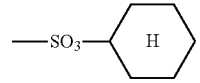
(2)

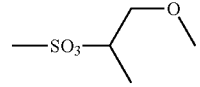
(3)

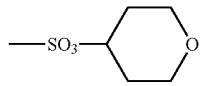
(4)

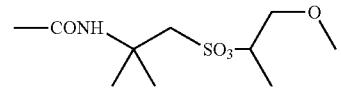
(5)

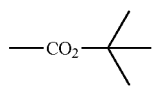
(6)

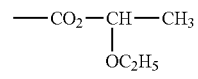
(7)

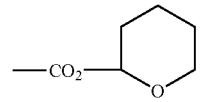
(8)

Functional Group (A-2) that Changes its Polarity from Hydrophilic to Hydrophobic by Heat or Acid In the invention, the functional group (A-2) that changes its polarity from hydrophilic to hydrophobic by heat or acid includes any known functional groups.

Hereinafter, examples of the functional groups (A-2) that changes its polarity from hydrophilic to hydrophobic by heat or acid and of the compounds having the functional group will be described.

Examples of the functional groups include the polymers containing an onium salt group described in JP-A No. 10-296895 and U.S. Pat. No. 6,190,830, and in particular, the polymers containing an ammonium salt group. Specific examples thereof include (meth)acryloyloxyalkyltrimethylammonium and the like.

The functional groups described in JP-A No. 2001-117223 are also favorable. Among the functional groups described in the patent publication above, the carboxylic acid groups and carboxylate salt groups represented by General Formula (3) are particularly preferable, but the invention is not limited to these examples. Hereinafter, specific examples of the particularly preferable functional groups are listed.

(9)

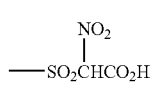
(10)

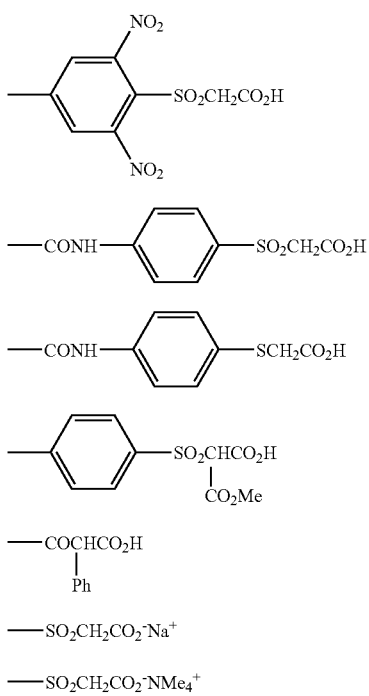

(11)
(12)
(13)
(14)
(15)
(16)
(17)

The graft polymer having a polarity-transition group according to the invention may be a homopolymer from a single monomer having the functional group above or a copolymer of two or more of such monomers. In addition, other monomers may be added to the copolymer in an amount that does not impair the advantageous effects of the invention.

Specific examples of the monomers having the functional group (A-1) that changes its polarity from hydrophobic to hydrophilic by heat or acid are shown below.

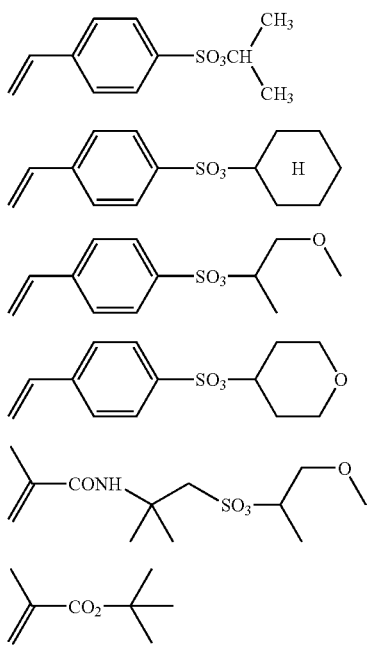

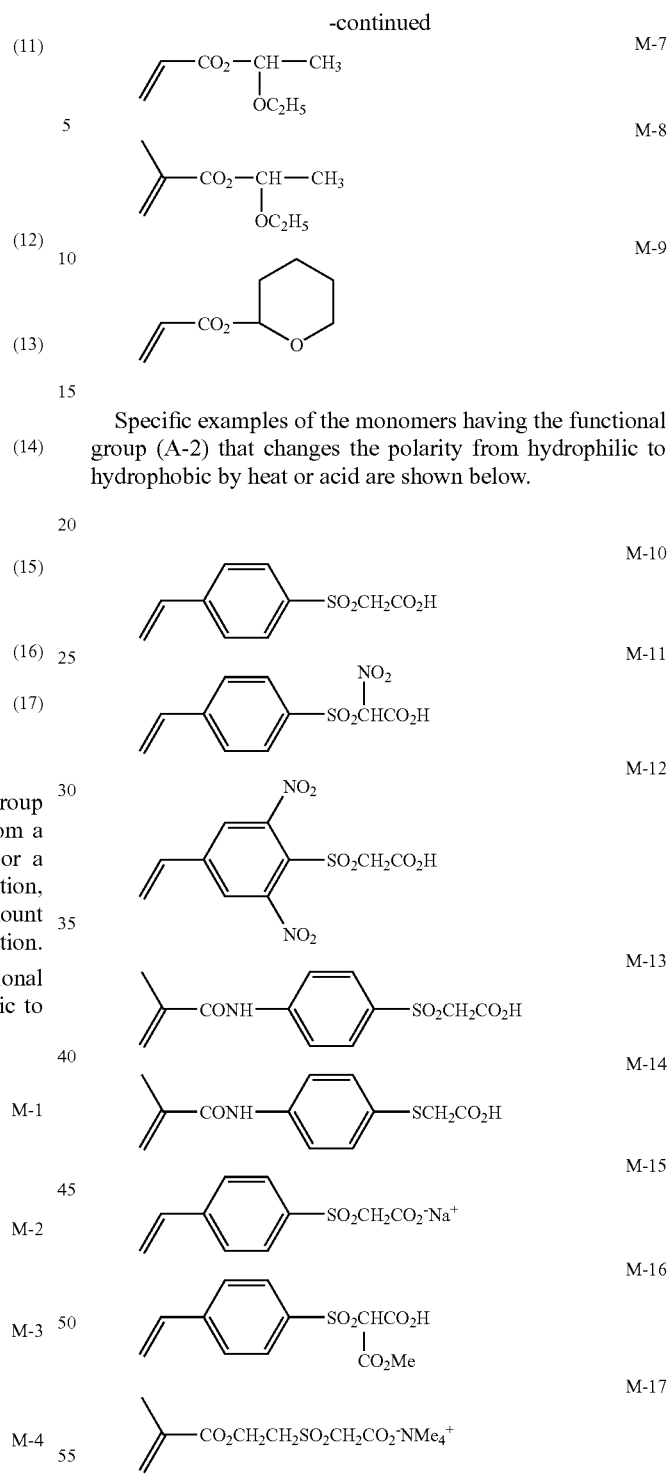

Specific examples of the monomers having the functional group (A-2) that changes the polarity from hydrophilic to hydrophobic by heat or acid are shown below.

Photo-Thermal Converting Material

If the energy applied to the polymer layer formed on a substrate for polarity transition by the surface graft polymerization described above is a light energy such as IR laser, it is preferable to add a photo-thermal converting material for converting the optical energy to thermal energy to any one of the polymer layer, substrate, and intermediate layer. Alternatively, it may be added to a photo-thermal converting material layer separately formed between the polymerization initiating layer and a base material.

Any compound may be used as the photo-thermal converting material as long as it is a material that absorbs light such as ultraviolet, visible, infrared, or white light and converts it to heat, and examples thereof include carbon black, carbon graphite, dyes, pigments, phthalocyanine pigments, metal fine particles such as iron powder, graphite powder, iron oxide powder, lead oxide, silver oxide, chromium oxide, iron sulfide, and chromium sulfide, and the like. Particularly preferable are the dyes, pigments, and metal fine particles that have the maximum absorption wavelength in the energy exposure wavelength region (760 to 1,200 nm) of the infrared laser used for applying energy.

Examples of the dye include commercially available dyes and publicly known dyes described in documents (for example, "Dye Handbook" 1970 edition, edited by the Society of Synthetic Organic Chemistry, Japan). More specifically, examples of the dye include dyes such as azo dyes, metallic complex salt azo dyes, pyrazolone azo dyes, anthraquinone dyes, phthalocyanine dyes, carbonium dyes, quinoneimine dyes, methine dyes, cyanine dyes, or metallic thiolate complexes. Preferable examples of dyes include, for example: cyanine dyes described in JP-A 58-125246, 59-84356, 59-202829, 60-78787; methine dyes described in Publication of Japanese Patent Application Laid-Open (JP-A) Nos. 58-173696, 58-181690, 58-194595 and the like; naphthoquinone dyes described in JP-A No. 58-112793, 58-224793, 59-48187, 59-73996, 60-52940, No. 60-63744 and the like; squarylium dyes described in JP-A No. 58-112792 and the like; and cyanine dyes described in GB Patent No. 434,875, and the like.

Near infrared absorbing sensitizers described in U.S. Pat. No. 5,156,938 are also preferably used. Further, preferable examples of the infrared absorbing sensitizers include substituted arylbenzo (thio) pyrylium salts described in U.S. Pat. No. 3,881,924, trimethine thiopyrylium salts described in Japanese Patent Application Laid-Open (JP-A) No. 57-142645 (U.S. Pat. No. 4,327,169), pyrylium compounds described in JP-A Nos. 58-181051, 58-220143, 59-41363, 59-84248, 59-84249, 59-146063, and 59-146061, cyanine dyes described in JP-A No. 59-216146, pentamethine thiopyrylium salts described in U.S. Pat. No. 4,283,475, pyrylium compounds described in JP-B Nos. 5-13514 and 5-19702, and the like. As another preferable example of the dye, near infrared absorbing dyes represented by either Formulas (I) or (II) described in the specification of U.S. Pat. No. 4,756,993 can also be mentioned. Particularly preferable examples thereof include the dyes, cyanine dyes, squarylium dyes, pyrylium salts, and nickel thiolate complexes.

Examples of the usable pigments include commercially available pigments and pigments described in: the Color Index (C.I.) Handbook, "*Latest Pigments Handbook*", 1977 edition, edited by the Society of Pigment Technology, Japan; "*Latest Applied Technology of Pigment*", 1986 edition, published by CMC; and/or "*Printing Ink Technology*", 1984 edition, published by CMC. Examples of kinds of the pigments include black pigments, yellow pigments, orange pigments, brown pigments, red pigments, purple pigments, blue pigments, green pigments, fluorescent pigments, metallic powder pigments, and polymer-bound dye. Specific examples of usable pigments include insoluble azo pigments, azo lake pigments, condensed azo pigments, chelate azo pigments, phthalocyanine compound pigments, anthraquinone compound pigments, perylene compound pigments, perinone compound pigments, thioindigo compound pigments, quinacridone compound pigments, dioxazine compound pigments, isoindolinone compound pigments, quinophthalone compound pigments, dyeing lake pigments, azine pigments, nitroso pigments, nitro pigments, natural pigments, fluorescent pigments, inorganic pigments, carbon black, and the like. Among the mentioned pigments, carbon black is preferably used.

When the photo-thermal converting material is used in the invention, in view of the sensitivity and the strength of the photo-thermal converting material-containing layer, a ratio of an amount of the photo-thermal converting material is preferably 0.01 to 50 mass %, and more preferably 0.1 to 10 mass %, relative to the total solid content of the layer including the photo-thermal converting material. When a dye is used as the photo-thermal converting material, a preferable ratio of an amount of the dye is 0.5 to 10 mass % relative to the total solid content of the layer including the dye. When a pigment is used as the photo-thermal converting material, a preferable ratio of an amount of the pigment is 3.1 to 10 mass % relative to the total solid content of the layer including the pigment.

Acid-Generating Material

In order to imparting an acid for polarity transition when the graft pattern is formed on the surface of the pattern forming material that uses the polymer having the polarity-transition group, it is preferable to add an acid-generating material to any one of constituents of the pattern forming material. Examples of the constituents to which the acid-generating material is added include the patter forming layer, the intermediate layer and the base material.

The acid-generating material is a compound that generates an acid by heat or light, and examples thereof generally include photoinitiators for photo-cation polymerization, photoinitiators for photo-radical polymerization, dye photo-decolorants, photo-alterants, conventionally-known compounds that optically generates an acid used in applications such as microresists, and the mixture thereof, and the like. Materials suitably selected from these can be employed in the invention.

Specific examples thereof include diazonium salts described in S. I. Schlesinger, Photogr. Sci. Eng., 18, 387 (1974), T. S. Bal et al., Polymer, 21, 423 (1980), and others; ammonium salts described in JP-A No. 3-140140 and others; phosphonium salts described in U.S. Pat. No. 4,069,055 and others; iodonium salts described in JP-A Nos. 2-150848 and 2-296514 and others; sulfonium salts described in J. V. Crivello et al., Polymer J. 17, 73 (1985), U.S. Pat. No. 3,902,114, E.P. Patent Nos. 233,567, 297,443, and 297,442, U.S. Pat. Nos. 4,933,377, 4,491,628, 5,041,358, 4,760,013, 4,734,444, and 2,833,827, German Patent Nos. 2,904,626, 3,604,580, and 3,604,581, and others;

selenonium salts described in J. V. Crivello et al., Macromolecules, 10(6), 1307 (1977) and others; onium salt including arsonium salts described in C. S. Wen et al., Teh, Proc. Conf. Rad. Curing ASIA, p. 478, Tokyo, October (1988), and others; organic halogen compounds described in JP-A No. 63-298339 and others; organic metal/organic halides described in JP-A No. 2-161445 and others; photochemical acid generators having an o-nitrobenzyl protecting group described in S. Hayase et al., J. Polymer Sci., 25, 753 (1987), JP-A Nos. 60-198538 and 53-133022, and others; compounds that generates sulfonic acid by photolysis represented by imino sulfonates and the like described in JP-A Nos. 64-18143, 2-245756, and 3-140109, and others; and disulfone compounds described in JP-A No. 61-166544 and others.

An amount of these acid-generating materials is in a range of 0.01 to 50% by mass, preferably in a range of 0.1 to 30% by mass with respect to the total solid matters in the layer containing the acid-generating material from the viewpoints of sensitivity and the strength of the layer containing the acid-generating material.

Functional Group (B) that Changes its Polarity by Light

Among many examples of the functional group that changes its polarity, there are some groups that change the polarity by irradiation of a light having a wavelength of 700 nm or less. Such functional groups (B) that change the polarity thereof by the light (polarity-transition group: polarity-transition group sensitive to a light at a wavelength of 700 nm or less) are characterized by changing the polarity with high sensitivity by causing a decomposition, ring opening, or dimerization reaction not by heat or irradiation of a longer wavelength light such as infrared ray but by irradiation of a light at a certain wavelength. Hereinafter, the functional groups that change the polarity by irradiation of a light at a wavelength of 700 nm or less will be described.

The functional groups (B) that change the polarity thereof by light are also classified into two groups, functional groups (B-1) that change the polarity thereof from hydrophobic to hydrophilic and function groups (B-2) that change the polarity thereof from hydrophilic to hydrophobic.

Functional Group (B-1) that Changes its Polarity from Hydrophobic to Hydrophilic Examples of the functional groups (B-1) that change the polarity thereof from hydrophobic to hydrophilic include the functional groups represented by General Formulae (1) to (4), and (7) to (9) described in JP-A No. 2003-222972.

Functional Group (B-2) that Changes its Polarity from Hydrophilic to Hydrophobic Examples of the functional groups (B-2) that change the polarity thereof from hydrophilic to hydrophobic include a bispyridinioethylene group.

Substrate

The substrate for use in embodiment (1) has a surface graft layer whereto the terminal of the polymer compound above having a polarity-transition group is chemically bonded directly or via a backbone polymer compound and a substrate surface whereto the terminal of the polymer compound can be chemically bonded directly or via a backbone polymer compound. As described above, the surface of base material may have such a property, or alternatively, an intermediate layer having such a property may be formed on the base material surface.

Substrate Surface

The substrate surface may be an inorganic or organic layer as long as the surface has a property suitable for forming the surface graft layer described above by graft synthesis. In this embodiment, a polarity of the substrate surface does not matter and may be hydrophilic or hydrophobic, since a transition between the hydrophilic and hydrophobic states is governed by a thin pattern-forming layer having the polymer compound.

In the intermediate layer, especially when the thin polymer layer of the embodiment is prepared by a photo-graft polymerization method, plasma irradiation graft polymerization method, or radiation graft polymerization method, the surface is preferably a layer having an organic surface, and is particularly preferably a layer having an organic polymer layer. Examples of the organic polymers include synthetic resins such as epoxy resins, acrylic resins, urethane resins, phenol resins, styrene resins, vinyl resins, polyester resins, polyamide resins, melamine resins, or formalin resins; and natural resins such as gelatin, casein, cellulose, or starch. Since the graft polymerization is initiated by abstracting of a hydrogen from the organic polymer in the photo-graft polymerization method, plasma irradiation graft polymerization method, radiation graft polymerization method and the like, use of a polymer highly vulnerable to hydrogen abstraction, such as acrylic resin, urethane resin, styrene resin, vinyl resin, polyester resin, polyamide resin, or epoxy resin is particularly preferable from the point of productivity.

The intermediate layer may either be the one which further plays the role of the base material described below or the one which is formed on the base material in accordance with necessity.

In the embodiment, in order to make the surface unevenness of substrate 500 nm or less when the substrate is formed from resin films or the like, it is preferable to adjust the surface unevenness of the base material (namely, the substrate) to 500 nm or less. In order to make the surface unevenness of substrate 500 nm or less when the substrate is formed by providing the intermediate layer to a surface of the base material, it is preferable to adjust the surface of the intermediate layer to 500 nm or less. In order to make the surface unevenness of substrate 500 nm or less, it is preferable to select a resin base material which is superior in surface smoothness and to form an intermediate layer superior in a thickness uniformity when the intermediate layer is formed.

Layer Having Polymerization Initiation Property

In embodiment (1), from the purpose of efficiently generating active site and improving the pattern-forming sensitivity, it is preferable to form a layer that can exhibit polymerization initiation property as an intermediate layer or a substrate surface by adding a polymerizable compound and a polymerization initiator to the base material surface as the compounds that can exhibit polymerization initiation property by application of energy.

The layer that can exhibit polymerization initiation property (hereinafter, appropriately referred to as a "polymerizable layer") can be formed by dissolving necessary components into a solvent that can dissolve these components, forming a layer on a surface of the base material by coating or the like, and hardening the layer by heating or photoirradiation.

(a) Polymerizable Compound

The polymerizable compound for use in polymerizable layer is not particularly limited as long as it adheres to the substrate tightly and binds to a hydrophilic compound that has a polymerizable group at a terminal and/or on a side chain thereof and is contained in the upper layer by application of energy such as an irradiation of activated light, and among many such compounds, a hydrophobic polymer having a polymerizable group in a molecule thereof is preferable.

Specific examples of the hydrophobic polymers include diene homopolymers such as polybutadiene, polyisoprene or polypentadiene, and homopolymers of an allyl group-containing monomer such as allyl(meth)acrylate or 2-allyloxyethyl methacrylate; two- or multi-component copolymers of styrene, a (meth)acrylic ester, (meth)acrylonitrile or the like and constituent units containing a diene monomer such as butadiene, isoprene or pentadiene or an allyl group-containing monomer; linear polymers or three-component polymers having a carbon-carbon double bond in the molecule thereof such as unsaturated polyester, unsaturated polyepoxide, unsaturated polyamide, unsaturated polyacryl, or high-density polyethylene; and the like.

In the specification, the group representing both or one of "acryl and methacryl" groups may be referred to as "(meth)acryl" group.

An amount of the polymerizable compound is preferably in a range of 0 to 100% by mass and more preferably in ae range of 10 to 80% by mass with respect to the solid matters in the polymerizable layer.

(b) Polymerization Initiator

The polymerizable layer in embodiment (1) preferably contains a polymerization initiator having polymerization initiation property by application of energy. The polymerization initiator used in the invention can be suitably selected from conventionally-known thermal polymerization initiators, photopolymerization initiators and the like that can exhibit polymerization initiation property by application of certain energy such as irradiation of an activated light, heating, irradiation of an electron beam or the like in accordance with purposes. Among these polymerization initiators, use of a photopolymerization initiator is preferable from the point of productivity because photopolymerization is higher in reaction speed (polymerization speed) than that of thermal polymerization.

The photopolymerization initiator usable in this embodiment is not particularly limited as long as it can be activated by the irradiating activated light and can polymerize the polymerizable compound contained in the polymerizable layer and a hydrophilic compound that is having a polymerizable group at a terminal or on a side chain thereof and is contained in the upper layer, and examples thereof include a radical polymerization initiator, an anionic polymerization initiator, a cationic polymerization initiator and the like.

Specific examples of the photopolymerization initiator include acetophenones such as p-tert-butyltrichloroacetophenone, 2,2'-diethoxyacetophenone, or 2-hydroxy-2-methyl-1-phenylpropane-1-one; ketones such as benzophenone, 4,4'-bisdimethylaminobenzophenone, 2-chlorothioxanthone, 2-methylthioxanthone, 2-ethylthioxanthone, or 2-isopropylthioxanthone; benzoin ethers such as benzoin, benzoin methylether, benzoin isopropylether, or benzoin isobutylether; benzyl ketals such as benzyldimethylketal or hydroxycyclohexylphenylketone; and the like.

An amount of the polymerization initiator is preferably in a range of 0.1 to 70% by mass and more preferably in the range of 1 to 40% by mass with respect to the solid matters in the polymerization layer.

The solvent used for applying (coating) the polymerizable compound and polymerization initiator is not particularly limited as long as it can dissolve these components. From the points of easiness in drying and workability, the solvent preferably does not have an excessively high boiling point, and more specifically, a solvent having a boiling point in a range of about 40 to 150° C. is preferable.

Specific examples thereof include acetone, methylethylketone, cyclohexane, ethyl acetate, tetrahydrofuran, toluene, ethylene glycol monomethylether, ethylene glycol monoethylether, ethylene glycol dimethylether, propylene glycol monomethylether, propylene glycol monoethylether, acetylacetone, cyclohexanone, methanol, ethanol, 1-methoxy-2-propanol, 3-methoxypropanol, diethylene glycol monomethylether, diethylene glycol monoethylether, diethylene glycol dimethylether, diethylene glycol diethylether, propylene glycol monomethylether acetate, propylene glycol monoethylether acetate, 3-methoxypropyl acetate, and the like.

These solvents may be used singly or in combination. An appropriate amount of solid matters in the coating solution is in a range of 2 to 50% by mass relative to a total mass of the coating solution.

When a polymerizable layer is formed on the base material to form the substrate, an amount of a coating amount of the polymerizable layer is preferably in a range of 0.1 to 20 g/m² as dry mass, and more preferably in a range of 1 to 15 g/m² as dry mass, in view of exhibiting sufficient polymerization initiating property and preventing layer peeling so as to maintain layer properties.

As is described above, the polymerizable layer is formed on a surface of the substrate by applying the composition for the polymerizable layer by coating or the like and removing the solvent so as to form the polymerizable layer to a film form. It is preferable to employ heating and/or photoirradiating for hardening the layer. In particular, it is preferable to dry the layer by heating and subsequently pre-harden the layer by photoirradiation, which allows hardening of the polymerizable compound to some extent, for effective prevention of troubles such as exfoliation of the entire polymerizable layer after the completion of the hydrophilic compound grafting. The reason for the use of photoirradiation for pre-hardening is the similar to that described in the section of the photopolymerization initiator.

A condition of the temperature and the period of the heating may be suitably selected so that it allows sufficient removal of the coating solvent, and the temperature is preferably 100° C. or less and the drying time is preferably 30 minutes or less. More preferably, the heating condition is selected so that a drying temperature thereof is in a range of 40 to 80° C. and a drying time thereof is in a range of 10 minutes or less from the viewpoint of productivity.

A light source for use in the pattern formation described below may also be used for the photoirradiation which can be conducted after heating as desire arises. In view of preventing inhibition to the subsequent formation of graft pattern and the bond formation between the active sites on the polymerizable layer and the graft chain by application of energy, it is preferable to conduct photoirradiation to an extent that allows a radical polymerization, which is not a complete polymerization but a partial polymerization, of the polymerizable compound present in the polymerizable layer. A time length of the photoirradiation may vary according to the strength of the light source used, and is generally preferably 30 minutes or less. A rough standard for the pre-hardening is a condition in which an amount of a residual layer after being washed with a solvent is 10% or less and an amount of a residual initiator after pre-hardening is 1% or more.

Base Material

The "substrate" used in the invention means a material to which a polymer is capable of directly bonding to a surface thereof. When an intermediate layer such as the polymerization initiating layer is formed on a surface of a material such as a resin film and a polymer is provided in a pattern form, the material such as the resin film is herein referred as a "base material".

The base material that is used in the metallic pattern of the invention and constitutes the substrate that is provided with the surface having the above-described characteristics is preferably a plate-shaped material having a smooth surface having a surface unevenness of 500 nm or less and high dimensional stability. Examples thereof include paper, paper laminated with plastics such as polyethylene, polypropylene, polystyrene or the like, metal plates (such as aluminum, zinc, copper or the like); plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinylacetal, polyimide, epoxy resins or the like); paper of plastic films whereon a metal described above is laminate or vapor deposited; and the like. A polyester or polyimide film is preferable as the substrate for use in this embodiment of the invention.

Further, when a printed wiring board is formed by using the metallic pattern of the present invention as a conductive layer, it is preferable to use an insulating resin as the substrate.

Examples of the insulating resin include resins formed of compounds such as polyphenylene ether, denatured polyphenylene ether, cyanate ester compounds, or epoxy compounds. A substrate formed of a thermosetting resin composition containing at least one of these resins is preferably used. When at least two of these resins are combined for forming the resin composition, preferable examples of a combination of the resins include: a combination of cyanate ester compounds and one of polyphenylene ether and denatured polyphenylene ether; a combination of epoxy compounds and one of polyphenylene ether and denatured polyphenylene ether, and a combination of cyanate ester compounds, epoxy compounds and one of polyphenylene ether and denatured polyphenylene ether. When a multilayer printed wiring board is formed by using the thermosetting resin compositions, use of the thermosetting resin compositions without containing inorganic fillers selected from a group consisting of silica, talc, aluminum hydroxide, and magnesium hydroxide is preferable. In addition, use of the thermosetting resin compositions further containing bromine compounds or phosphorous compounds is preferable.

Preferable example of the insulating resins for forming the substrate of a printed wiring board further includes a 1,2-bis (vinyl phenylene) ethane resin and a denatured resin formed of a polyphenylene ether resin and the 1,2-bis(vinyl phenylene) ethane resin. Further details of this resin are described in "Journal of Applied Polymer Science" edited by Satoru Amaba et al, vol. 92, pp. 1252 to 1258 (2004).

Preferable examples of other insulating layers further include a liquid crystal polymer which may be commercially available as "VECSTER" (trade name, manufactured by Kuraray Co., Ltd.) and a fluororesin such as polytetrafluoroethylene.

Among these resins (polymer materials), polytetrafluoroethylene (PTFE) is a material which is most excellent in a high frequency characteristics. However, since PTFE is a thermal plastic resin having low Tg and has poor dimensional stability with respect to heat. PTFE is inferior to a thermosetting resin material in mechanical strength. Further, PTFE has a problem of being poor in formability and workability. A thermoplastic resin such as polyphenylene ether (PPE) can be used by being alloyed with a thermosetting resin or the like. Examples of alloy include: an alloy resin of PPE and an epoxy resin; an alloy resin of PPE and triallylisocyanate; and an alloy resin of a PPE resin having a polymerizable functional group introduced therein and other thermosetting resins.

Unmodified epoxy resin exhibit insufficient dielectric characteristics. However, improvements of properties of epoxy resins are intended by introduction of bulky skeleton or the like. In this way, resins in which the respective characteristics thereof are used to a large extent and a structure introduction, denaturation or the like is employed for compensating drawbacks thereof is preferable.

For example, although cyanate ester is a material having the most excellent dielectric characteristics among thermosetting resins, it is rarely used singly, and it is rather used as a denatured resin of an epoxy resin, a maleimide resin or a thermoplastic resin. For further details, see "Electronic technology" No. 9, pp. 35 (2002), the disclosures of which can be referred for selecting insulating resins as described above.

As described above, when the metallic pattern is used as a wiring (conductive layer) for a printed wiring board, in order to reduce delay and damping of signals from a viewpoint of processing of mass storage data at high speed, it is effective to decrease each of a dielectric constant and a dielectric loss tangent. Use of low dielectric loss tangent materials is exactly as described in "Electronics Packaging Institutional Journal" vol. 7, No. 5, pp. 397 (2004). From a viewpoint of data processing at high speed, use of insulating materials having low dielectric loss tangent characteristics is particularly preferable. More specifically, it is preferable that the substrate is formed by an insulating resin whose dielectric constant, i.e. relative dielectric constant, is 3.0 or less at 1 GHz, and it is more preferable that the substrate is formed by an insulating resin whose dielectric constant is 0.01 or less at 1 GHz. The dielectric constant and dielectric loss tangent of the insulating resin can be determined by a conventional method, for example, a method described in the Abstracts of 18$^{th}$ JIEP Annual Meeting, 2004, p 189, in which a cavity resonator perturbation method using a measuring device and system ∈r and tan δ for an ultra thin sheet manufactured by Keycom Co., Ltd is used. Thus, it is useful to select the insulating resin in light of dielectric constant and dielectric loss tangent. Examples of the insulating resin having a dielectric constant of 3.5 or less and a dielectric loss tangent of 0.01 or less include a liquid crystal resin, a polyimide resin, a fluororesin, a polyphenylene ether resin, a cyanate ester resin, a bis (bisphenylene) ethane resin and the like, and further include modified resins thereof.

Formation of Pattern (Image)

In embodiment (1), a pattern is formed by irradiation of a radiant ray such as light. When the photoirradiation is carried out in the presence of a photo-thermal converting material, the pattern can be formed by heating via scanning exposure of a laser beam having a wavelength of infrared ray region or the like.

Examples of the method for forming the pattern include methods including writing by heating or radiant ray irradiation including exposure to light. Specific examples thereof include photoirradiation using an infrared laser, ultraviolet lamp, visible light or the like, electron beam irradiation such as a gray irradiation, thermal writing by thermal head, and the like. Examples of light sources used therefor include a mercury lamp, a metal halide lamp, a xenon lamp, a chemical lamp, a carbon arc lamp, and the like. Examples of the radiation include electron beam, X ray, ion beam, far-infrared ray, and the like. In addition, g-ray, i-ray, Deep-UV ray, and high-density energy beam (laser beam) may be used.

Specific examples of commonly used-embodiments include direct writing by thermal recording head or the like; scanning exposure by infrared laser; high-illumination flash exposure by xenon discharge lamp or the like; infrared ray lamp exposure; and the like.

Alternatively, in the case of a polymer layer obtained by using the polarity-transition group sensitive to a light at a wavelength of 700 nm or less, any photoirradiation method may be used as long as it induces the polarity transition in a pattern forming layer, namely, it can change a hydrophilicy/hydrophobicity of the polarity-transition group by decomposing, opening or dimerizing the polarity-transition group. For example, photoirradiation by an ultraviolet lamp or of visible light, and the like are available therefor. Examples of these light sources include a mercury lamp, a metal halide lamp, a xenon lamp, a chemical lamp, a carbon arc lamp and the like.

It is preferable to use the method of inducing polarity transition for direct patterning based on digital data of computer by laser exposure. Examples of the lasers include gas lasers such as carbonic acid gas laser, nitrogen laser, Ar laser, He/Ne laser, He/Cd laser or Kr laser; solid state lasers such as liquid (dye) laser, ruby laser, or Nd/YAG laser; semiconductor lasers such as GaAs/GaAlAs or InGaAs lasers; excimer lasers such as KrF laser, XeCl laser, XeF laser or Ar$^2$ laser; and the like.

Embodiment (2)

In embodiment (2), a graft pattern is formed by bringing a compound having a polymerizable group and a functional group that interacts with an electroless plating catalyst or a precursor thereof into contact with a substrate and then irradiating a radiant ray in the pattern form. In the description below, the "functional group that interacts with an electroless plating catalyst or a precursor thereof" may be referred to an "interactive group", and the compound having a polymerizable group and an interactive group may be referred to an "interactive group-containing polymerizable compound".

Formation of Graft Pattern by Surface Grafting

In embodiment (2), by binging the interactive group-containing polymerizable compound into contact with a substrate and applying energy in the pattern form, it is possible to form chemical bonds between the polymerizable group of the interactive group-containing polymerizable compound and the substrate and to form a stiff region superior in durability that interacts with an electroless plating catalyst or a precursor thereof (hereinafter, may be referred simply to as "interactive region" if necessary). This kind of formation of bonds is referred as a "surface grafting". The surface grafting according to embodiment (2) is almost similar to the surface graft polymerization described in embodiment (1) above. While the polymer compound to be grafted has a polarity-transition group in embodiment (1), the composition containing the interactive group-containing polymerizable compound in this embodiment is directly brought into contact with the substrate surface so that the composition is bound to the active species generated on the substrate surface.

The contact of the composition and the active species may be carried out by immersing the substrate in a liquid composition containing the interactive group-containing polymerizable compound. Alternatively, in view of easiness in treating and efficiency in productivity, it is preferable to provide a layer which contains a composition containing the interactive group-containing polymerizable compound as a main component to a surface of the substrate by a coating method as described below.

Surface grafts relating to the embodiment (2) can be formed in the same manner as the surface grafts explained in embodiment (1).

Interactive Group-Containing Polymerizable Compound

The interactive group-containing polymerizable compound used in the embodiment is a polymer wherein an addition-polymerizable ethylenic unsaturated group (polymerizable group) such as a vinyl group, an allyl group or a (meth) acryl group is introduced as the polymerizable group to a monomer having an interactive group described below or a homopolymer or a copolymer obtained by using at least one group selected from such monomers. The polymer has a polymerizable group at least at a terminal or on a side chain thereof. It is preferable that the polymer has a polymerizable group at a terminal thereof, and it is more preferable that the polymer has polymerizable groups at both of a terminal and a side chain thereof.

The interactive group-containing polymerizable compound can be synthesized as follows.

Examples of synthesizing the interactive group-containing polymerizable compound include Examples of the synthesizing methods include i) a method in which a monomer having the interactive group and a monomer having the polymerizable group are copolymerized, ii) a method in which the monomer having the interactive group and a monomer having a double-bond precursor are copolymerized and then treated with a base or the like to introduce a double bond, and iii) a method in which the monomer having the interactive group and the monomer having the polymerizable group are reacted with each other to thereby introduce a double bond (the polymerizable group). Among these methods, ii) the method in which the monomer having the interactive group and the monomer having the double-bond precursor are copolymerized and then treated with a base or the like to introduce a double bond, and iii) method in which the monomer having the interactive group and the monomer having the polymerizable group are reacted with reach other to thereby introduce the polymerizable group are preferably employed in terms of a synthetic aptitude.

Specific examples of the monomer used for synthesizing the polymerizable compound including the interactive group include (meta) acrylic acid, alkali metal salts and amine salts thereof, itaconic acid, alkali metal salts and amine salts thereof, 2-hydroxyethyl(meta)acrylate, (meta) acrylamide, N-monomethylol (meta) acrylamide, N-dimethylol (meta) acrylamide, arylamine or hydrogen halide acid salt thereof, 3-vinylpropionic acid, alkali metal salts and amine salts thereof, vinylsulfonic acid, alkali metal salts and amine salts thereof, 2-sulfoethyl (meta) acrylate, polyoxyethyleneglycol mono(meta)acrylate, 2-acrylamide-2-methylpropane sulfonic acid, acidphosphooxypolyoxyethyleneglycolmono (meta)acrylate, and N-vinylpyrrolidone (having the following structure) In summary, monomers having a functional group such as a carboxyl group, a sulfonic acid group, a phosphorous acid group, an amino group, a hydroxyl group, an amide group, a phosphine group, an imidazole group, a pyridine group or an ether group (or salts thereof when a salt structure can be formed thereby) are referred as the examples

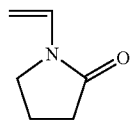

Examples of an allyl group-containing monomer which is capable of copolymerizing with the interactive group include allyl(meta)acrylate, 2-allyloxyethyl methacrylate and the like Examples of the monomer having the double-bond precursor include 2-(3-chloro-1-oxopropoxy)ethylmethacrylate and 2-(3-bromo-1-oxopropoxy)ethylmethacrylate.

Examples of the monomer having the polymerizable group, which is used for introducing the unsaturated group utilizing the reaction with the functional group such as a carboxyl group or amino group or salt thereof, a hydroxyl group, an epoxy group or the like in the polymer having the interactive group, include (meta)acrylic acid, glycidyl(meta) acrylate, allylglycidyl ether, 2-isocyanatether(meta)acrylate and the like.

Examples of the interactive group-containing polymerizable compound further include a macromonomer. The methods for producing the macromonomer used in the embodiment include, for example, various methods described in "Synthesis of Macromonomers" of the second chapter of "Chemistry and Industry of Macromonomers" (Ed., Yuya Yamashita) published by Industrial Publishing & Consulting, Inc., Sep. 20, 1989. Particularly preferable examples of the macromonomers used in this embodiment include macromonomers derived from a carboxyl group-containing monomer such as acrylic acid or methacrylic acid; sulfonic acid-based macromonomers derived from monomers such as 2-acrylamide-2-methylpropanesulfonic acid, vinylstyrene sulfonic acid, or salts thereof; amide-based macromonomers derived from monomers such as (meth)acrylamide, N-vinylacetamide, N-vinylformamide, or N-vinylcarboxylic acid amide; macromonomers derived from hydroxyl group-containing monomers such as hydroxyethyl methacrylate, hydroxyethyl acrylate, or glycerol monomethacrylate; macromonomers derived from alkoxy group- or ethylene oxide group-containing monomers such as methoxyethyl acrylate, methoxy polyethylene glycol acrylate, or polyethylene glycol acrylate; and the like. In addition, macromonomers having a polyethylene glycol chain or a polypropylene glycol chain may also be effectively used as the macromonomer used in the embodiment.

The molecular weight of these macromonomers is favorably in a range of 250 to 100,000 and particularly preferably in a range of 400 to 30,000.

Solvent used for the composition containing an interactive group-containing polymerizable compound is not particularly limited as long as it can dissolve the primary component thereof, i.e., the macromonomers, monomers and the like. Preferable examples of the solvent include a water-based solvent such as water, a water-soluble solvent, mixture thereof, or those which further contain a surfactant.

The "water-soluble solvent" is a solvent which can be blended with water in an arbitrary ratio, and examples thereof include alcoholic solvents such as methanol, ethanol, propanol, ethylene glycol, glycerinor the like; acids such as acetic acid; ketone solvents such as acetone; amide solvents such as formamide; and the like.

The surfactant, which may be added to the solvent in accordance with necessity is not particularly limited as long as it is soluble to the solvent, and examples thereof include anionic surfactants such as sodium n-dodecylbenzenesulfonate; cationic surfactants such as n-dodecyltrimethylammonium chloride; nonionic surfactants such as polyoxyethylene nonylphenol ether (examples of commercial product thereof include EMULGEN 910 (trade name, manufactured by Kao Corporation)), polyoxyethylene sorbitan monolaurate (examples of commercial product thereof include "TWEEN® 20"), and polyoxyethylene laurylether; and the like.

The compositions can be directly contacted to the substrate in an arbitrary manner when the compositions are in liquid states. A coating amount of a layer formed by coating the interactive group-containing composition is preferably in a range of 0.1 to 10 $g/m^2$, and more preferably in a range of 0.5 to 5 $g/m^2$, based on a solid content of the layer in order to obtain a uniform coating film and to sufficiently exert the interaction with the plating catalyst or the precursor thereof.

Substrate

The substrate used in embodiment (2) is a substrate having a surface onto which a terminal or a side chain of the interactive group-containing polymerizable compound above can be chemically bonded directly or via a backbone polymer compound. The base material may have such a property as it is, or alternatively, an intermediate layer having the property may be formed on the base material to form the substrate.

Further, an additional layer having a property of initiating polymerization can be formed in a similar manner to embodiment (1).

In embodiment (2), use of a substrate having a surface unevenness of 500 nm or less is also preferable.

Formation of Pattern (Image)

The method of imparting energy used in the pattern formation in embodiment (2) is not particularly limited, and any method may be used as long as it can generate active sites on the substrate surface and supply an energy sufficient to bind the polymerizable group of the interactive group-containing polymerizable compound to the substrate surface. The method of irradiating activated light is preferable from the viewpoints of cost and simplicity of the device.

If irradiation of activated light is employed, either scanning exposure based on digital data or pattern exposure by using a lith film may be used.

Any one of the various writing methods described in embodiment (1) above may also be favorably used as the method of pattern writing in this embodiment.

By the energy application as described above, a graft pattern having graft chains higher in motility is formed by polymerization of the interactive group-containing polymerizable compound and the active sites generated on the substrate surface. In a preferable embodiment, use of an interactive group-containing polymerizable compound having polymerizable groups at a terminal or on a side chain allows additional binding of graft chains to the polymerizable groups on the side chain of the graft chains bound to the substrate, providing a branched graft chain structure and consequently leading to drastic improvement in the density and motility of the graft formed and higher interaction with the electroless plating catalyst or precursor thereof.

(b) Imparting Electroless Plating Catalyst or Precursor Thereof onto Graft Pattern Electroless Plating Catalyst The electroless plating catalyst used in the present process is mainly a zero-valent metal, and examples thereof include Pd, Ag, Cu, Ni, Al, Fe, Co and the like. In the invention, Pd and Ag are preferable in terms of easy handling and superiority of catalyzing ability. Methods for fixing the zero valent metal onto the graft pattern (interactive region) generally use a metallic colloid in which a charge is adjusted. The metallic colloid can be produced by reducing the metal ion in a solution in which a charged surfactant or a charged protective agent is present. The charge of the metallic colloid can be adjusted by the used surfactant or protective agent. When the metallic colloid in which the charge is thus adjusted is made to interact with the interactive group on the graft pattern, the metallic colloid can be selectively adsorbed onto the graft pattern.

Precursor of Electroless Plating Catalyst

As the precursor of the electroless plating catalyst used in the present process, any substance can be employed without limitation as far as the substance can serve as the electroless plating catalyst through a chemical reaction, and the zero valent metal ion used in the electroless plating catalyst is mainly used. The metal ion, which is the precursor of the electroless plating catalyst, results in the zero valent metal serving as the electroless plating catalyst through a reduction reaction. The metal ion may be changed into the zero valent metal through another reduction reaction, or may be dipped in the electroless plating bath as the precursor of the electroless plating catalyst to be thereby changed into metal by a reducing agent in the electroless plating bath.

The metal ion, which is the precursor of the electroless plating catalyst, is actually imparted to the graft pattern in a state of a metal salt. As the metal salt that is used, any substance can be employed without limitation as long as the substance can be dissolved in an appropriate solvent and dissociated into the metal ion and base (anion). Specific examples of the metal salt include $M(NO_3)_n$, $MCl_n$, $M_{2/n}(SO_4)$, $M_{3/n}(PO_4)$ (in which M represents an n-valent metal atom) and the like. Examples of suitably used metal ion include the metal ions formed by dissociating the metal salts. Specific examples of the metal ion include a silver ion, a copper ion, an aluminum ion, a nickel ion, a cobalt ion, in iron ion, a palladium ion and the like. The silver ion and a palladium ion are preferably used in terms of catalyzing ability.

Examples of the method for imparting the metallic colloid as the electroless plating catalyst or the metal salt as the electroless plating precursor onto the graft pattern include a method which includes dispersing the metallic colloid in an appropriate dispersion medium or the metal salt is dissolved in an appropriate solvent so as to prepare a solution including the dissociated metal ion, and spreading the solution on the base material surface on which the graft pattern is present, and a method which includes dipping the base material having the graft pattern in the solution. When the solution including the metal ion is brought into contact with the base material, the metal ion can be adsorbed to the interactive group on the pattern region by utilizing an inter-ion interaction or a dipole-ion interaction. In order to sufficiently perform the adsorption or impregnation, the concentration of the metal ion or concentration of the metal salt in the solution brought into contact, is preferably in a range of 1 to 50 mass %, and more preferably in the range of 1 to 30 mass %. A length of time required for the contact is preferably approximately one minute to 24 hours, and more preferably approximately five minutes to one hour.

(c) Forming Metallic Film by Electroless Plating

In the method of the invention, a patterned metallic film is formed by the electroless plating on the substrate resulting from the process (b). In this process, the electroless plating is performed in the presence of the surface charge modifier (first aspect) or performed in the electroless plating bath containing a specific amount of the plating catalyst poison (second aspect), in order to form a highly finely-patterned metallic film with a sufficient thickness.

Concerning the electroless plating treatment, for example, the literatures J. W. M. Jacobs and J. M. G. Rikken, J. Electrochem. Soc., 135, 2822 (1988) and A. M. T. van der Putten, G. de. Bakker et al., J. Electrochem. Soc., 140, 2229 (1993) disclose a technique for forming a thin anisotropic plating film, which includes growing the plating film only in a desired direction. These literatures suggest that there is a possibility that the shape of metallic films can be controlled in electroless plating. However, in contrast to the invention, these literatures neither disclose nor suggest its applicability to the formation of fine patterns for wiring or the like or its usability.

A number of published literatures including JP-A No. 2003-49280 disclose that surfactants having a structure analogous to that of the surface charge modifier used in the invention may be added to electroless plating solutions so as to stabilize plating baths. However, the inventors have first found that anisotropic growth can be used for the formation of patterned metallic films as in the invention, and the advantageous effect of the invention can be achieved only when the anisotropic growth technique is used in combination with the technique which includes providing, in a patterned form, a polymer that has a functional group capable of interacting with the electroless plating catalyst or a precursor thereof and is directly and chemically bonded to the substrate.

It is also known that a plating bath can be stabilized by adding a plating catalyst poison to an electroless plating solution similarly to the invention, for example, as disclosed in JP-A No. 09-287078. However, the inventors have first found that plating catalyst poisons can be useful for the formation of patterned metallic films as disclosed herein, and the advantageous effect of the invention can be achieved only when the plating catalyst poison is used in combination with the technique which providing, in a patterned form, a polymer that has a functional group capable of interacting with the electroless plating catalyst or a precursor thereof and is directly and chemically bonded to the substrate.

The surface charge modifier may be allowed to act at any stage in the electroless plating process. The surface charge modifier may be added to the solution of the electroless plating bath for electroless plating treatment, or the surface of the substrate may be pretreated with the surface charge modifier before the electroless plating process.

Specifically, the former manner corresponds to the process (c-1) of forming a metallic film in the pattern form by subjecting the substrate having the polymer layer to electroless plating using an electroless plating solution, and the latter manner corresponds to the process (c-2) of treating the substrate having the polymer layer with a bath containing the surface charge modifier and the process (c-3) of subjecting the substrate having the polymer layer to electroless plating so as to form the metallic film in the pattern form.

The surface charge modifier is preferably an organic compound having, in its molecule, (i) a group having an affinity for the substrate and (ii) an ionic leaving group. If the electroless plating is performed in the presence of this surface charge modifier, a metallic film which has a high density and sufficient thickness and accords to the graft pattern which is obtained by the above process can be formed on the pattern. As a result, the formed metallic pattern has high electrical conductivity and good adhesion.

In the electroless plating process, any method may be used to add the plating catalyst poison to the plating bath. A specific amount of the catalyst poison may be added to the electroless plating solution before the plating is started or after the plating is started. Alternatively, the plating catalyst poison may be added at a certain time intervals such that the concentration of the plating catalyst poison in the solution of the electroless plating bath is maintained within a specific range or may be added as needed such that its concentration is maintained within a specific range while the concentration is measured.

Typically, the process (c-1') may include subjecting the polymer layer-carrying substrate to the electroless plating with an electroless plating solution containing $1\times10^{-10}$ to $1\times10^{-4}$ mmol/l of the plating catalyst poison to form a pattered metallic film, and the process (c-2') may include subjecting the polymer layer-carrying substrate to the electroless plating to form a patterned metallic film while adding the plating catalyst poison to the electroless plating solution such that the concentration of the plating catalyst poison is maintained within the range of $1\times10^{-10}$ to $1\times10^{-4}$ mmol/l.

Hereinafter, each of the processes will be described in detail.

Forming Metallic Film in Pattern Form by Subjecting Substrate Having Polymer Layer to Electroless Plating Using (C-1) Electroless Plating Solution Containing Surface Charge Modifier or (c-2) $1\times10^{-10}$ to $1\times10^{-4}$ mmol/l of Plating Catalyst Poison Electroless Plating Electroless plating is a process of depositing a metal in a chemical reaction by using a solution containing the metal ion to be deposited, and the metal deposition leads to increase in conductivity. The electroless plating in this process is carried out, for example, by removing excess metals and metal salts remaining on the substrate having an electroless plating catalyst in the pattern form obtained in process (b) by washing with water and immersing it in an electroless plating bath which contains a surface charge modifier or a plating catalyst poison. Any electroless plating bath commonly known in the art may be used as components of the electroless plating bath other than the surface charge modifier and the plating catalyst poison. The electroless plating solution (bath) that is used for forming a metallic film by using an electroless plating catalyst precursor which resides on the graft pattern by being absorbed or immersed can also employ any electroless plating bath commonly known in the art.

Generally, electroless plating baths have a composition which contains (1) a plating metal ion, (2) a reducing agent, and (3) an additive (stabilizer) for stabilization of the metal ion as main components. In this embodiment, the electroless plating baths further contain (4) a surface charge modifier or a plating catalyst poison which are described below. In addition to these, the plating baths may further contain any conventionally-known additives such as a stabilizer of the plating solution or the like.

The metals used in the electroless plating bath include copper, tin, lead, nickel, gold, palladium, and rhodium, and among them, copper and gold are particularly preferable from the viewpoint of conductivity.

Examples of a metallic compound usable in the electroless plating solution for the electroless plating bath include sulphate salts, sodium salts, carbonates, oxides, hydroxides and the like. An amount of the metallic compound contained in the electroless plating solution is in a range of 0.1 to 5 g/L, preferably in a range of approximately 0.8 to 1.2 g/L in terms of an amount of metal. When the amount of the metallic compound is below 0.1 g/L, it is not preferable for the invention since the formation of the metallic film becomes insufficient and thus a deposition of electroplating in a following process becomes insufficient. On the other hand, when the amount of the metallic compound exceeds 5 g/L, it is not preferable for the invention since there is no additional effect obtained by raising a concentration, and an increase in a required amount of complexing agent which is in proportion to the concentration is disadvantageous in economical view, and in addition to these, applicability to a wastewater treatment of the solution becomes deteriorated.

Optimum reducing agent and additives can be selected according to the metal. For example, a copper electroless plating bath contains $Cu(SO_4)_2$ as copper salt, HCOH as the reducing agent, and additives such as EDTA (stabilizer for copper ion), a Rochelle salt (chelating agent) or the like. A plating solution used for electroless plating of CoNiP contains cobalt sulfate and nickel sulfate as the metal salts, sodium hypophosphite as the reducing agent, and sodium malonate, sodium malate, sodium succinate as complexing agents. Further, a palladium electroless plating bath contains $(Pd(NH_3)_4)Cl_2$ as the metal ion, $NH_3$ and $H_2NNH_2$ as the reducing agent, and EDTA as the stabilizer. These plating solutions may also contain components other than the components described above.

Specific examples of sugars which has a reducing property and is added to the electroless plating solution include dextrose, glucose, sorbitol, cellulose, sucrose, mannitol, and gluconolactone. A content of the sugars may be from about 3 to about 50 g/L, preferably from about 10 to about 20 g/L. A content of the sugar of less than 3 g/L is not preferred, because with such a content, the formation of the electroless plating film can be insufficient so that the deposition performance of electroplating in the next process can be poor. A sugar content of more than 50 g/L is not preferred, because with such a content, the stability of the electroless plating solution can be reduced and an electroplating film with poor appearance can easily be formed.

Examples of the complexing agent to be added to the electroless plating solution include hydantoins, organic carboxylic acids, and organic aminocarboxylic acids. Specific examples of the hydantoins include hydantoin, 1-methylhydantoin, 1,3-dimethylhydantoin, 5,5-dimethylhydantoin, and allantoin. Specific examples of the organic carboxylic acids include citric acid, tartaric acid, succinic acid, and malonic acid. Specific examples of the organic amino carboxylic acids include ethylenediaminetetraacetic acid, 1,3-propanediaminetetraacetic acid, NTA, ethylenediaminebissuccinic acid, iminodiacetic acid, and any salts thereof. The complexing agent may be used singly or in combination of two or more thereof.

An amount of the complexing agent blended in the electroless plating solution may be in a range of about 2 to about 50 g/l, preferably in a range of about 10 to about 40 g/l. An amount of the blended complexing agent of less than 2 g/l is not preferred, because such an amount can provide insufficient complexing power and thus insufficient solubility of copper. An amount of the blended complexing agent of more than 50 g/l is not preferred, because such an amount is economically disadvantageous and can make waste water treatment complicated, though the solubility of copper is improved.

Examples of the reducing agent include organic aldehydes such as formalin or glyoxylic acid, sugars, reducing phenols such as hydroquinone, hypophosphorous acids, borohydrides, and diamine borane. In view of plating rate, formalin and borohydrides are preferred because of their high reducing ability. When sugars having relatively low reducing ability are used as the reducing agent, hydantoins having relatively low complexing ability may be used as the complexing agent.

It is necessary for the electroless plating solution to further contain an alkali metal hydroxide. The alkali metal hydroxide is preferably sodium hydroxide, potassium hydroxide or lithium hydroxide in terms of easy availability and cost. The alkali metal hydroxide may be used singly or in combination of plurals in accordance with necessity. An amount of the alkali metal hydroxide to be blended in the solution may be in a range of about 10 to about 80 g/l, preferably in a range of about 30 to about 50 g/l. An amount of the alkali metal hydroxide of less than 10 g/l is not preferred, because with such an amount, the formation of the plating metallic film can be insufficient so that the deposition performance of electroplating in the next step can be poor in a low current density range. An amount of the alkali metal hydroxide of more than 80 g/l is not preferred, because with such an amount, the solubility of copper can be reduced as the concentration is increased, which can lead to poor stability of the plating solution.

When the electroless plating solution is prepared, a combination and a blending ratio of the respective components as described above are preferably appropriately adjusted within the above ranges so that a pH of the plating bath becomes in a range of 10.0 to 14.0, preferably in a range of 11.5 to 13.5.

If necessary, the electroless plating solution may further contain a stabilizing agent such as potassium ferrocyanide, rhodan salt, a pyridine compound, tannic acid, or rhodanine The addition of only a small amount (several mg/l) of any of these compounds allows maintaining good stability.

In the treatment process with the electroless plating solution, the temperature of the solution may be in a range of about 20 to about 70° C., preferably in a range of about 35 to about 50° C., and the material may be immersed in the plating solution for about 30 seconds to about 120 minutes, preferably for about 10 to 60 about minutes. A plating solution temperature of lower than 20° C. is not preferred, because at such a temperature, the formation of the electroless plating film can be insufficient. A plating solution temperature of higher than 70° C. is not preferred, because the stability of the plating solution can be reduced at such a temperature. An immersion time of less than 30 seconds in the plating solution is not preferred, because for such a time, the formation of the electroless plating film can be insufficient. An immersion time of more than 120 minutes is not preferred, because for such a time, the effect cannot be found beyond an optimal range and the productivity can be reduced.

Surface Charge Modifier

The surface charge modifier used in the invention may be any compound as long as it is capable of being adsorbed to the base material surface and capable of inhibiting the adsorption of metal ions to the base material. An organic compound having (i) a group having an affinity for the substrate and (ii) an ionic leaving group (dissociable group) in its molecule is preferably used.

Herein, (i) the group having an affinity for the substrate includes a hydrophobic or lipophilic functional group. Preferable examples thereof include an alkyl group having 4 or more carbon atoms, an aromatic group having 6 or more carbon atoms, and a fluorinated alkyl group having 3 or more carbon atoms. Preferable examples of (ii) the ionic leaving group include a carboxyl group, an amino group, an ammonium group, and a sulfoxyl group. An organic compound having these functional groups in its molecule is preferred compound as the surface charge modifier.

For example, when an organic compound having an ammonium group is used, it is selectively adsorbed to the substrate surface so that the surface is positively charged. In this case, a surface potential of the substrate is preferably in a range of +0.1 mV to +500 mV, more preferably in a range of +1.0 mV to +100 mV. The region with such a positively-charged surface is resistant to a deposition of metal ions (such as $Cu^{2+}$) from the plating bath, and thus the metal ions are selectively deposited only on the region that has the plating catalyst (or precursor) attached to the patterned graft polymer.

In view of enabling forming finer patterns, this process is preferably performed after a thin metallic film is formed on the graft pattern by the use of a surface charge modifier-free electroless plating bath for the purpose of preventing undesired adsorption of the surface charge modifier to a portion of a hydrophilic group, such as a carboxyl group, which is unreacted and left in the graft chain.

The surface charge modifier for use in the invention is preferably a low-molecular or high-molecular organic ammonium compound.

Preferable examples of the low-molecular organic ammonium compound include the compounds represented by the following Formula (C-1).

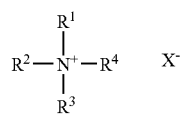

Formula (C-1)

In Formula (C-1), $R^1$ to $R^4$ each independently represent a monovalent organic group, and preferably represent an alkyl group which may have a substitutent or an aryl group which may have a substitutent. Examples thereof include alkyl groups having 1 to 20 carbon atoms such as a methyl group, an ethyl group or a butyl group and aryl groups such as alkyl groups such as a phenyl group, a naphthyl group or a benzyl group having a phenyl group as a substient.

$X^-$ represents a counter anion, and specific examples thereof include $CH_3SO_4^-$, $C_2H_5SO_4^-$, $Cl^-$, $Br^-$, $HSO_4^-$, $H_2PO_4^-$, $CH_3COO^-$, $CH_3SO_3^-$, and $NO_3^-$.

Preferable examples of the macromolecular organic ammonium compound include copolymers produced by copolymerizing a monomer having a quaternary ammonium salt group, a monomer having an ethylene glycol chain, and a monomer having hydrocarbon having 4 or more carbon atoms; and copolymers produced by copolymerizing a monomer having an amine group, a monomer having an ethylene glycol chain, and a monomer having hydrocarbon having 4 or more carbon atoms and quaternarizing the resulting copolymer.

Any polymerizable monomer having a quaternary ammonium group may be used as the monomer having the quaternary ammonium salt group for forming the copolymer (the macromolecular organic ammonium compound) according to the invention. Examples thereof include (meth)acrylates, acrylamides, allyl ethers, vinyl ethers, vinyl esters, and styrene and substituted styrenes (substitutents therefor are similar to those for $R^4$ in the following Formula (C-2)). In particular, (meth)acrylates or acrylamides having a quaternary ammonium salt group are preferable examples of (meth)acrylates having a quaternary ammonium salt group include the compounds represented by Formula (C-2) below. Examples of the monomer also include betaine type compounds such as monomers produced by quatenarizing dimethylaminoethyl acrylate with bromoethanol or sodium chloroacetate.

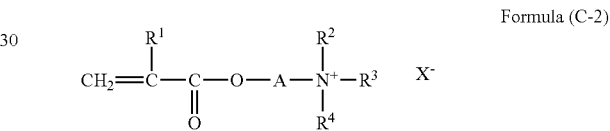

Formula (C-2)

In Formula (C-2), $R^1$ represents a hydrogen atom or —$CH_3$; $R^2$ and $R^3$ each independently represent a hydrogen atom, an alkyl group having 1 to 4 carbon atoms, or a hydroxyalkyl group having 1 to 4 carbon atoms; $R^4$ represents an alkyl group of 1 to 20 carbon atoms, a hydroxyalkyl group having 1 to 10 carbon atoms, or an aralkyl group having 1 to 10 carbon atoms; A represents an alkylene or oxyalkylene group having 1 to 10 carbon atoms or a polyoxyalkylene group having 1 to 10 carbon atoms; and $X^-$ represents a counter anion.

Herein, the counter anion represented by $X^-$ has the same meaning as in Formula (C-1), and preferable examples thereof are also the same.

Any copolymerizable compound having an ethylene glycol chain in its molecule may be used as the monomer having the ethylene glycol chain for forming the organic ammonium compound according to the invention. Examples thereof include (meth)acrylates, acrylamides, allyl ethers, vinyl ethers, vinyl esters, and styrene and substituted styrenes (substitutents therefor are similar to those for $R^4$ in Formula (C-2)), each having an ethylene glycol chain in the molecule. In particular, preferable examples include (meth)acrylates having an ethylene glycol chain. Examples of the (meth)acrylates having the ethylene glycol chain include (poly) ethylene glycol mono(meth)acrylates represented by Formula (C-3):

Formula (C-3)

In Formula (C-3), n represents an integer of 1 to 50, preferably of 4 to 20; $R^5$ represents a hydrogen atom or —$CH_3$; and $R^6$ represents a hydrogen atom, —$CH_3$ or —$C_2H_5$.

Examples of the ethylene glycol monochain-containing monomer include commercially available products such as AE-350 (trade name, n: 6 to 8) manufactured by Nippon Oil & Fats Co., Ltd.

Any copolymerizable monomer having a hydrocarbon structure having 4 or more carbon atoms in its molecule may be used as the monomer having hydrocarbon having 4 or more carbon atoms for forming the organic ammonium compound. Examples thereof include (meth)acrylates, acrylamides, allyl ethers, vinyl ethers, vinyl esters, and styrene and substituted styrenes (substituents therefor are similar to those for $R^4$ in Formula (C-2)), each having hydrocarbon. In particular, preferable examples include (meth)acrylates having hydrocarbon.

The hydrocarbon may have any structure such as a saturated, unsaturated, linear, branched, or cyclic structure. The hydrocarbon is preferably a linear hydrocarbon having 4 or more carbon atoms, preferably having 4 to 30 carbon atoms, more preferably having 6 to 22 carbon atoms. In the invention, preferable examples of the monomer having hydrocarbon having 4 or more carbon atoms include alkyl esters formed of a (meth)acrylic acid and a linear aliphatic alcohol having 4 or more carbon atoms, preferably having 4 to 30 carbon atoms, and more preferably having 6 to 22 carbon atoms. Preferable examples thereof include lauryl acrylate.

Any copolymerizable monomer having an amino group may be used as long as it has an amine group and is capable of being copolymerized. Examples thereof include (meth)acrylates, acrylamides, allyl ethers, vinyl ethers, vinyl esters, and styrene and substituted styrenes (substitutents therefor are similar to those for $R^4$ in Formula (C-2)), each having an amine group. Particularly preferable examples thereof include (meth)acrylates and acrylamides each having an amine group. Examples thereof further include compounds having a cyclic structure, and specific examples thereof include acrylmorpholine. Specific examples of the monomer having the amino group include dimethylaminoethyl(meth)acrylate, dimethylaminopropyl acrylate, dimethylacrylamide, acrylmorpholine, isopropylacrylamide, and diethylacrylamide.

The monomers used in the preparation of the organic ammonium compound according to the invention, namely, the monomers having a quaternary ammonium salt group, the monomers having an ethylene glycol chain, the monomers having hydrocarbon having 4 or more carbon atoms, and the monomers having an amine group, may be used singly or two or more in combination for forming the copolymer.

The amount of the surface charge modifier added to the electroless plating solution for use in the invention is preferably adjusted such that the concentration of the surface charge modifier in the electroless plating bath is set in a range of $1\times10^{-6}$ to $1\times10^{-1}$ mol/l, and more preferably in a range of $5\times10^{-4}$ to $2\times10^{-2}$ mol/l.

The concentration of the surface charge modifier in the solution should be adjusted in such a manner, because if the concentration is too low, the function of controlling the growth of the plating film cannot be sufficiently obtained so that the metallic film-growth-inhibiting effect in the width direction can tend to be reduced and because if the concentration is too high, adsorption of the modifier to the plating catalyst can occur so that the plating rate or the deposition of the plating metal can tend to be reduced, and thus both cases are not preferred.

In the invention, generally-known electroless plating process may be performed while it further includes the addition of the surface charge modifier to the plating bath.

While the thickness of the resulting metallic film can be controlled by the concentration of the metal salt or metal ions in the plating bath, a time length of the immersion to the plating bath, a temperature of the plating bath and the like, it is preferably 0.5 µm or more, and more preferably 3 µm or more, in view of electrical conductivity.

The length of time of the immersion in the plating bath is preferably in a range of about 1 minute to about 3 hours, more preferably in a range of about 1 minute to about 1 hour. In conventional methods, an extended immersion time in plating baths or an increase in metal ion concentration of plating baths additionally promotes growth of metallic films in an undesired direction of pattern width so that it is difficult to form desired very fine patterns of metal. In contrast, according to the method of the invention, metallic films are grown selectively in the thickness direction, so that metallic films with sufficient thickness can be obtained with no limitation relating processes and that very fine patterns of metal with sufficient thickness can be easily formed.

Plating Catalyst Poison

Examples of the plating catalyst poison used in the electroless plating according to the invention include metal ions, inorganic anions, an organic compound having a group having an affinity for a plating metal in its molecule, and an organic compound having a group having an affinity for plating metal and an ionic leaving group in its molecule.

Examples of metal ions serving as the plating catalyst poison for use in the invention include metal ions selected from ions of any one of Pb, Sn, As, Sb, Bi, Cr, Mo, Cd, In, Tl, W, Nb, and Ti. Preferable metal ions are appropriately selected depending on the species of the metal used in the electroless plating. When copper, silver or gold is used as the plating metal, metal ions of Pb, Sn, Sb, or Bi are preferably used.

Examples of the inorganic anions serving as the plating catalyst poison include an iodine anion, a bromine anion and a sulfide anion, and an iodine anion is particularly preferable.

Examples of the organic compound having, in its molecule, a group having an affinity for plating metal include organic compounds having a functional group having an affinity for plating metal and a substituent selected from an alkyl group, an aryl group, and a heterocyclic group, as listed below.

Examples of the group having an affinity for plating metal include a carboxyl group, a carbonyl group, an amino group, a mercapto group, and a thiocarbonyl group. Preferable examples of the functional group depend on the species of the plating metal. When the plating metal is a good electrical conductor such as copper, silver or gold, a mercapto group or a thiocarbonyl group is preferable.

Examples of sulfur-containing organic compounds having a mercapto group or a thiocarbonyl group for use as the plating catalyst poison include thiol compounds, compounds convertible into thiol compounds due to tautomerism, disulfides, thioamides, and thioureas.

Examples of the thiol compounds include thiocyanuric acid, 2-mercaptothiazoline, 2-mercaptopyridine, 2-mercaptobenzothiazole, and 2-phenyl-5-mercaptotetrazole. Examples of the compounds convertible into thiol compounds by tautomerism include 2-thiobarbituric acid, 2-imidazolidinethione, 1-phenyl-2-tetrazoline-5-thione, and 2-thiouracil.

Examples of the disulfides include dibenzothiazyl disulfide and tetramethylthiuram disulfide.

Examples of the thioamides include N-tert-butyl-2-benzothiazolyl sulfenamide. Examples of the thioureas include thiourea, methylthiourea, and octylthiourea.

The organic compound having a group having an affinity for plating metal in its molecule for use as the plating catalyst poison may further have an ionic substituent in its molecule. Herein, the ionic substituent includes a carboxyl group, an amino group, an ammonium group, a sulfoxyl group and the like.

Examples of the organic compound having a group having an affinity for plating metal and an ionic leaving group in its molecule include 2-(3-carboxyl-phenyl)-5-mercaptotetrazole, 2-(3-sulfoxyl-phenyl)-5-mercaptotetrazole, thiosalycilic acid, 2-(3-(2-aminoethyl)-phenyl)-5-mercaptotetrazole, sodium 2-mercaptobenzothiazole-5-sulfonate, and sodium 2-(2-mercaptobenzothiazolyl)ethanesulfonate.

The amount of the plating catalyst poison added to the electroless plating solution for use in the invention should be adjusted such that the concentration of the plating catalyst poison in the electroless plating solution is set in a range of $1 \times 10^{-10}$ to $1 \times 10^{-5}$ mol/l, more preferably in a range of $1 \times 10^{-7}$ to $5 \times 10^{-6}$ mol/l.

The concentration of the plating catalyst poison in the solution should be adjusted as described above, because if the concentration is too low, the function of controlling the growth of the plating film can be insufficient so that the metallic film-growth-inhibiting effect in the width direction can tend to be reduced and because if the concentration is too high, the electroless plating itself can be inhibited so that the plating rate or the deposition of the plating metal can tend to be reduced, and thus both cases are not preferable.

The plating catalyst poison may be added in a form of a solution thereof to the electroless plating solution. The plating catalyst poison may be preliminarily added to the electroless plating solution to provide a specific concentration or may be added at once at a time when a certain period passed after the electroless plating is started.

It is well known that when no plating catalyst poison is added, plating rate (or deposition rate of plating metal) is generally low at the initial stage of plating and then increases as the plating proceeds. Thus, the latter process, that includes stating plating with no addition of an effective concentration of the catalyst poison and then adding the compound serving as the catalyst poison to provide a concentration in the above range when a certain period passed after the electroless plating is started, is a preferable mode of the process that includes adding the plating catalyst poison to the electroless plating bath to form the electroless plating solution with a concentration in the above range.

In the invention, generally-known electroless plating may be performed except that it further includes the addition of the plating catalyst poison to the plating bath.

While the thickness of the resulting metallic film can be controlled by the concentration of the metal salt or metal ions in the plating bath, the immersion time in the plating bath, or the temperature of the plating bath, it is preferably 0.5 µm or more, more preferably 3 µm or more, in view of electrical conductivity.

A time length of the immersion in the plating bath containing the plating catalyst poison is preferably in a range of about 1 minute to about 3 hours, more preferably in a range of about 1 minute to about 1 hour. In conventional methods, an extended time length of the immersion in plating baths or an increase in metal ion concentration of plating baths further promotes growth of metallic films in undesired directions of pattern width so that it is difficult to form desired very fine patterns of metal. According to the method of the invention, however, metallic films are grown selectively in the thickness direction, so that metallic films with sufficient thickness can be obtained with no limitation relating to processes and that very fine patterns of metal with sufficient thickness can be easily formed.

In a preferable mode of such a metallic film, a relation $(q-p) < r$ is satisfied, wherein p represents a line width of the pattern layer in the pattern form, q represents a line width of the metallic film formed by the electroless plating, and r represents a thickness of the metallic film formed by the electroless plating. Such a patterned metallic film, which results from metallic film growth specifically in the thickness direction and from inhibited metallic film growth in the width direction, can be preferably used for wiring circuits and the like as described later.

A description is given below for explaining a process including treating the substrate by using the surface charge modifier followed by electroless plating the substrate that can be used in the first aspect of the method.

Process (C-2): Treating Polymer Layer-Carrying Substrate with Surface Charge Modifier-Containing Bath In this embodiment, depositing the electroless plating catalyst or a precursor thereof on the polymer layer (b) is followed by immersing, in a surface charge modifier-containing solution, the material having the electroless plating catalyst (or precursor) deposited on the patterned graft polymer layer, which is formed on the surface of the resulting substrate, so that the surface charge modifier is selectively adsorbed to a portion of the surface of the substrate that does not have the polymer layer.

The surface charge modifier for use in this embodiment may be similar to that used in the process (c-1). Specifically, the surface modifier is dissolved in distilled water-miscible organic solvent such as ethanol so as to form a surface charge modifier solution.

In this case, an amount of the surface charge modifier solution added to the bath is preferably adjusted such that the concentration of the surface charge modifier in the bath is set in a range of $1 \times 10^{-6}$ to $1 \times 10^{-1}$ mol/l, more preferably of $5 \times 10^{-4}$ to $2 \times 10^{-2}$ mol/l.

In this treatment, a temperature of the bath solution is preferably in a range of about 5 to about 60° C., and the immersion time is preferably in a range of 20 seconds to 10 minutes. After the immersion, washing with water or any other process may be performed to remove an excessive amount of the surface charge modifier solution.

Process (c-3): Subjecting Surface Charge Modifier-Treated Substrate to Electroless Plating The process (c-2) of treating the polymer layer-carrying substrate with the surface charge modifier-containing bath is followed by electroless plating. This process may be similar to the process (c-1) and use the similar treatment conditions such as time length of the immersion time, except that the plating bath used herein contains no surface charge modifier.

Further, a description is given below for explaining a process including performing the electroless plating while adding the plating catalyst poison to the electroless plating solution that can be used in the second aspect of the method.

Process (c-2'): Subjecting Polymer Layer-Carrying Substrate to Electroless Plating Containing $1 \times 10^{-10}$ to $1 \times 10^{-4}$ mmol/l of Plating Catalyst Poison In this embodiment, depositing the electroless plating catalyst or a precursor thereof on the polymer layer (b) is followed by a process that includes adding the plating catalyst poison to a plating solution when the material having the electroless plating catalyst (or precursor) deposited on the patterned graft polymer layer, which is formed on the surface of the resulting substrate, is subjected to the electroless plating; and performing the electroless plating while the concentration of the plating catalyst poison in the plating bath is maintained in a range of $1\times10^{-10}$ to $1\times10^{-4}$ mmol/l. This process may be similar to the process (c-1) and use the similar treatment conditions such as time length of the immersion time except that the concentration of the plating catalyst poison in the plating bath is controlled.

As is similar to the process (c-1), the concentration of the plating catalyst poison in the electroless plating solution should be in a range of $1\times10^{-10}$ to $1\times10^{-5}$ mol/l, and is more preferably of $1\times10^{-7}$ to $5\times10^{-6}$ mol/l.

The addition of the plating catalyst poison may be performed by adding a catalyst poison solution to the electroless plating solution. The catalyst poison solution may be added at once at a time when a certain period passed after the electroless plating is started or may be added in a predetermined amount at regular time intervals, or may be continuously and gradually added using a pump or the like.

In view of increasing an accuracy of concentration control, the electroless plating process preferably includes placing a detector capable of monitoring, in real time, the concentration of the plating catalyst poison in the plating solution and sending a signal from the detector to a catalyst poison-feeding pump such that the concentration of the catalyst poison in the plating solution is controlled to the desired level while the electroless plating is performed.

In this embodiment, the method preferably includes either maintaining the concentration of the plating catalyst poison lower than a predetermined range at the beginning of the electroless plating or adding no plating catalyst poison at the beginning of the electroless plating and then adding the plating catalyst poison after the plating is started such that the concentration is controlled in the above range.

After the metallic pattern was formed by the processes (c-1), the combination of the processes (c-2) and (c-3), the processes (c-1') or the process (c-2'), from a viewpoint of increasing adhesiveness, it is preferable to conduct a drying process on the obtained metallic pattern. The drying process can use any means such as natural drying, heat drying, reduced pressure drying, and air drying. Among them, the drying process is preferably carried out at or around ordinary temperature in view of preventing deterioration of the polymer layer due to the drying process. More specifically, natural drying of a material having a polymer layer and a metallic film preserved under normal temperature atmosphere, drying under reduced pressure at normal temperature and air-drying at normal temperature are preferably used. In order to remove water contained in the polymer layer as much as possible without heating, these processes are performed for one hour or more, preferably 24 hour or more. The drying condition can suitably be selected taking into account of the adhesiveness required. Specifically, for example, the drying method includes a method for preserving the material having a polymer layer and the metallic film for about 1 to 3 days, about 1 to 3 weeks or about 1 to 3 months under temperatures at about 25° C., and a method for preserving it under reduced pressure for about 1 to 3 days or about 1 to 3 weeks.

Although the action in which the drying treatment can improve adhesiveness is not clear enough, it is assumed that sufficient drying can prevent water, which may deteriorate adhesiveness, from being accumulated into a conductive pattern material, and deterioration of adhesiveness with time due to water can be reduced.

SEM observation of the cross section of the metallic film portion of the metallic pattern thus obtained revealed that there are a great number of fine particles of electroless plating catalyst and plating metal tightly dispersed in the surface graft layer and an additional layer of relatively larger particles deposited thereon. Because the interface is in a hybrid state of the graft polymer and the fine particles, the adhesiveness is better even when the unevenness of the interface surface between the substrate (organic component) and the inorganic matters (electroless plating catalyst and plating metal) is 500 nm or less, or 100 nm or less of preferable embodiment.

The state of fine particles such as electroless plating catalysts and metals deposited by an electroless deposition in the surface graft polymer layer will be described hereinafter in detail. The particles composed electroless plating catalysts and/or metals deposited by an electroless plating are dispersed in the polymer layer (graft polymer layer), at a high density toward a substrate from an interface between the polymer layer and the metallic film. In the dispersed state of the fine particles, it is preferable that a region where 25% by volume or more, more preferably 30% by volume, still more preferably 40% by volume or more, most preferably 50% or more of the fine particles exist in the vicinity of the interface in view of exerting adhesive effect of the metallic film. The region where the fine particles exist at a high density in the polymer layer extends in a range of preferably 0.05 μm or more, more preferably 0.1 μm or more, still more preferably 0.2 μm or more, most preferably 0.3 μm or more from the interface of the polymer layer and the metallic film in a direction toward the substrate.

Electroplating

The metallic pattern forming method according to the invention may have an additional process for electroplating after the above described process by using the metallic film as an electrode. It allows easily preparing an additional new metallic film having a desirable thickness on the basis of the metallic pattern that is superior in adhesiveness to substrate. Addition of this process expands the thickness of the patterned metallic film to a desirable value, thus it is advantageous for applying the metallic pattern according to the invention to various applications including wire patterning.

Any conventionally-known method may be used as the electroplating process in the invention. Metals used in the electroplating in this process include copper, chromium, lead, nickel, gold, silver, tin, zinc, and the like, and copper, gold, and silver are preferable, and copper is more preferable from the point of conductivity.

A thickness of the metallic film obtained after electroplating varies according to applications and can be controlled by adjusting the concentration of the metal contained in the plating solution, time length of immersion, electric current density and the like. The thickness of common metallic films used for electric wiring or the like is preferably 0.5 μm or more and more preferably 3 μm or more from the point of conductivity.

Metallic Pattern

The metallic pattern according to the invention is characterized by having a metallic film which is locally formed on a substrate, in which the substrate has a surface unevenness of 500 nm or less, preferably 100 nm or less, and an adhesiveness between the substrate and the metallic film is 0.2 kN/m or more. That is, the metallic pattern s characterized by having a smooth substrate surface and an excellent adhesiveness between the substrate and the metallic film.

More specifically, the metallic pattern according to the invention is a metallic pattern that is locally provided with a metallic film that is formed by providing, on a substrate having a surface, in the pattern form, a polymer having a functional group that interacts with an electroless plating catalyst or a precursor thereof that can chemically bind to the substrate, imparting an electroless plating catalyst or a precursor thereof onto the pattern, and then electroless plating the resulting pattern, wherein the substrate has an unevenness of 500 nm or less, preferably 100 nm or less, and an adhesiveness between the substrate and the metallic film is 0.2 kN/m or more.

Such a metallic pattern may be prepared similarly to the metallic pattern forming process, except that it further includes selecting a substrate having a surface unevenness of 500 nm or less as the substrate among the substrates described for the metallic pattern forming method.

The surface unevenness is a value determined by cutting the substrate or the thus-formed metallic pattern in the direction perpendicular to the substrate surface and observing the cross section thereof by SEM.

More specifically, the surface unevenness should be 500 nm or less in terms of Rz as determined according to the conventionally-known method, i.e., the difference between the average of the Z data of the highest to fifth highest peaks and the average of those of the deepest to fifth deepest bottoms on a particular surface.

A value of the adhesiveness between the substrate and the metallic film is determined by adhering a copper plate (thickness: 0.1 mm) to the surface of a metallic pattern (width: 5 mm) with an epoxy-based adhesive (trade name: ARALDITE, manufactured by Ciba-Geigy Corp.), drying the test sample at 140° C. for 4 hours, and then conducting a 90-degree peeling test according to a conventionally-known testing method for copper-laminated plate for wiring pattern plates (IEC 60429-1 (1982)), or by directly removing a peripheral portion of the metallic pattern and then conducting the 90-degree peeling test according to the conventionally-known testing method for copper-laminated plate.

With common metallic patterns, it is possible to obtain a metallic pattern superior in high frequency characteristics by making the unevenness of the interface between the substrate and the metal 500 nm or less. However, a reduction in substrate surface unevenness of conventional metallic patterns is often accompanied with decrease in the adhesiveness between the substrate and the metallic film. Therefore, the interface unevenness of conventional metallic patterns was commonly 1,000 nm or more.

In contrast, because the substrate interface is in a state of hybrid which is formed by a combination of a metallic component of the metallic film and the graft polymer directly bonded to the substrate, the metallic pattern according to the invention has a small unevenness in the interface between the layer of plating metal and plating catalyst (inorganic component) the polymer layer (organic component) and constantly has an excellent adhesiveness.

The metallic pattern according to the invention is characterized by selecting a substrate having a surface unevenness of 500 nm or less. The surface unevenness is preferably 300 nm or less, still more preferably 100 nm or less, and particularly preferably 50 nm or less. The lower limit of the surface unevenness is not particularly restricted; however, it is thought to be about 5 nm from the practical points of easiness of production and others. If the metallic pattern according to the invention is used for metallic wiring, smaller surface unevenness favorably leads to decrease in the unevenness of the interface between the metal for wiring and the organic material and thus leads to smaller electric power loss during high-frequency electric transmission.

If expressed in the 10-point-average unevenness (Rz) which is measured by a method following to the above-described conventionally-known method, the substrate surface unevenness is selected in a range of 500 nm or less, preferably 300 nm or less, still more preferably 100 nm or less, and particularly preferably 50 nm or less.

Substrates inherently having a smoother surface such as resin substrates may be used as the substrate, and even if a substrate higher in surface unevenness is used, it is possible to control the surface unevenness into the preferred range by providing the intermediate layer.

Further, the metallic pattern according to the invention characteristically has an adhesiveness between the substrate and the metallic film of 0.2 kN/m or more, preferably 0.3 kN/m or more. There is no particular maximum limitation for the value for the adhesiveness; however, the commonly-agreed range thereof is about 0.2 to 2.0 kN/m. In conventional metallic patterns, the adhesiveness between the substrate and the metallic film is commonly in a range of about 0.2 to 3.0 kN/m. Considering the fact above, it is understood that the metallic pattern according to the invention has a practically sufficient adhesiveness.

As described above, the metallic pattern according to the invention reduces the unevenness of the surface of the substrate in the interface to the maximum degree while maintaining the adhesiveness between the substrate and the metallic film.

The resulting very fine metallic pattern having sufficient thickness is a product produced by a simple low-cost process and provides a substrate on which a metal circuit is formed with an improved adhesion between the metal and the substrate. Thus, the substrate provides a useful electrically-conducting wiring substrate, which is applicable to various kinds of printed-wiring boards, TFT wiring circuits, flexible switches, battery electrodes, solar cells, sensors, integrated circuits, and motor housings.

Printed-Wiring Boards

The printed-wiring board of the invention can be produced by forming an electrically-conducting layer (wiring) of the metallic pattern according to the invention on a substrate.

There is no particular restriction with regard to the substrate, and examples thereof include known laminates such as laminates of glass cloth and epoxy resin, laminates of paper and phenol resin, laminates of paper and epoxy resin, laminates of glass cloth, glass paper and epoxy resin. Examples thereof further include bismaleimide-triazine resin impregnated substrates (BT substrates) and polyimide film substrates using a polyimide film as a base material.

In order to form a circuit layer, the electrically-conducting layer (metallic pattern) formed with the graft polymer on the substrate according to the invention may be used in combination with any known method as needed. Examples of the known methods of manufacturing wiring boards include a subtractive method including using a copper-clad laminate (a laminate of a copper foil and the insulating substrate) and removing an unnecessary part of the copper foil by etching, and an additive method including forming a circuit on a necessary part of the insulating substrate by electroless plating. Both sides of a copper-clad laminate having copper foils on both surfaces thereof may also be used to form circuit layers on both sides of an insulating substrate.

An insulating material layer is stacked on the circuit substrate when a wiring board (multilayer printed wiring board) is manufactured by building-up an electric circuit substrate formed on an insulating material layer. If desired, a primer layer for use in the formation of a graft polymer layer may be formed on the insulating material layer.

If necessary, a surface of the circuit layer may be surface-treated so as to have a state suitable for adhesion. Examples of a technique for the surface-treating include, but not limited to, a known methods such as that including forming a needle crystal of copper oxide on the surface of the circuit layer with an aqueous alkaline solution of sodium hypochlorite and reducing the formed needle crystal of copper oxide by immersing the needle crystal in an aqueous solution of dimethylamine borane.

The laminate of the circuit substrate and the insulating material layer may be formed by a method that includes placing the circuit substrate opposite to either an insulating material layer or another circuit substrate formed on an insulating material layer and performing heating and/or pressing to laminate them. This lamination process may use an oil hydraulic pressing or any other technique such as a vacuum pressing or a vacuum lamination. In particular, a vacuum pressing and a vacuum lamination are preferably used, because they can prevent air trapping in the laminated layers during laminating and provide high performance in embedding inner circuits in the laminated layers.

The insulating material layer may be formed by any method, and examples thereof include a method including applying a varnish of an insulating resin composition onto a support, drying the varnish to form a supported insulating film, and stacking it on a circuit board to form the insulating material layer. When the varnish is applied onto the circuit board, any general coating method may be used, such as bar coating, spin coating, and screen printing. When the varnish is applied onto the support, a comma coater, a bar coater, a kiss coater, a roll coater, or the like may be appropriately used depending on the thickness of the insulating material layer. In all the cases, any coating thickness, any drying conditions after the coating and the like may be used, while 80% by weight or more of the solvent of the varnish is preferably volatilized by drying. Examples of the support to which the varnish is applied include plastic films such as PET films and metal foils. The support may be separated and removed after the varnish is cured. In such a case, a releasing plastic film or the like is preferably used as the support. A metal foil such as a copper foil serving as the substrate may be continuously used for a second circuit layer without being peeled. The insulating resin composition layer of the supported insulating film is opposed to the circuit layer of the circuit board and laminated with the circuit board using a lamination method or a press apparatus. If necessary, the insulating resin composition layer may preferably be cured by heat.

A second electrically-conductive pattern (second circuit) is formed on the insulating material layer so that a multilayer wiring board is produced. This process preferably uses the electrically-conducting layer formed with the graft polymer according to the invention. In this case, a process for forming a hole in the insulating material layer may be performed before the graft pattern is formed. Any method such as a laser method or a sand blasting method may be used to form the via hole.

An electrically-conducting material layer may be formed on the pattern and into the via hole at the same time by having an electrically-conducting material adhered thereto or by electroless plating.

In some cases, an inner surface of the via hole is preferably slightly roughened as needed before such a process as plating is performed to impart electrical conductivity. Examples of a solution for the roughening include oxidative roughening solutions such as chromium/sulfuric acid roughening solutions, alkali permanganate roughening solutions, sodium fluoride/chromium/sulfuric acid roughening solutions or fluoroboric acid roughening solutions. For example, the surface-roughening treatment includes immersing a substrate for 1 minute in an aqueous solution of diethylene glycol monobutyl ether and NaOH, which is heated at 70° C. and serves as a swelling solution; immersing the substrate for 2 minutes in an aqueous solution of KMnO and NaOH, which is heated at 80° C. and serves as a roughening solution; and subsequently immersing the substrate in a neutralizer solution such as an aqueous hydrochloric acid solution of stannous chloride (SnCl2) at room temperature for 5 minutes for neutralization. The roughening process may be followed by a process of depositing a plating catalyst (palladium), which may be performed by immersing the substrate in a palladium chloride-based plating catalyst solution. The substrate is then immersed in an electroless plating solution such that an electroless plating layer (conductor layer) with a thickness of 0.3 to 1.5 µm is deposited on the graft pattern (and the inner surface of the via hole if the via hole is formed before this process). If necessary, further electroplating may be performed such that the desired thickness is obtained. Any conventionally-known electroless plating solution may be used in the electroless plating without particular restriction. Any known conventionally-known may also be used in the electroplating without particular restriction. In these plating processes, copper plating is preferably used. The manufacturing process provides a second electrically-conductive pattern, and according to the metallic pattern-forming method of the invention, very fine circuit patterns of metal having a sufficient thickness can be formed. Thus, a circuit having a high quality and is free from shape degradation can be formed by the invention.

Subsequently, a multilayer wiring board having three or more layers may be produced. In such a case, another second insulating material layer may be formed on the second electrically-conductive pattern, and the same process may be repeated to provide a multilayer wiring board with three wiring layers, and then if desired, a wiring board with more wiring layers may be formed by the similar manner.

The method of manufacturing printed-wiring boards using the electrically-conducting layer formed by the metallic pattern-forming method of the invention is characterized in that insulation characteristics are easily ensured when circuits are formed. In conventional semi-additive methods, an entire surface of an insulating substrate is subjected to electroless copper plating or deposition of an electroless copper plating catalyst so that the metal can easily remain and cause a reduction in insulation between wirings on the resulting wiring board. In contrast, according to the forming method of the invention, electroless copper plating or deposition of an electroless copper plating catalyst is not imparted (adhered) to the entire surface of the insulating substrate but imparted (adhered) only to the pattern necessary for wiring so that the above problem in which the electroless copper plating or the catalyst remains on portions which are other than the pattern and to be insulating part would not occur. Thus, the method of producing wiring boards according to the invention allows a formation of high-density circuits (wirings) with good adhesion to the substrate, sufficient conductivity and good insulating characteristics.

Thin Film Transistor

The thin film transistor (TFT) of the invention may be formed by a process that includes forming the electrically-conducting layer (serving as a gate electrode) by the metallic pattern-forming method of the invention and then sequentially forming a gate insulating film, a semiconductor film, and source-drain electrodes, on the gate electrode.

The gate electrode of the metallic layer (electrically-conducting layer) in the TFT is composed of a metallic film, which is formed, by a plating method, on a patterned graft polymer formed on a glass substrate. The electrically-conducting layer is preferably formed of copper metal, and a sheet resistance thereof is preferably about 0.1

SiNx film is formed on the gate electrode by CVD. An a-Si film serving as a channel layer, an n+ type a-Si film serving as a contact layer, a source Al electrode, a drain electrode, a pixel ITO electrode, and an insulating protective SiNx film are further formed thereon.

The TFT device having the gate electrode formed by the method of the invention may have an inverted staggered structure (bottom gate structure), or the gate electrode according to the invention may be used to form a TFT with a staggered structure (top gate structure). The electrically-conducting layer formed in the desired pattern according to the invention may be used to form not only TFTs but also any other non-linear devices such as two-terminal diodes.

The gate electrode or the metal wiring obtained by the metallic pattern-forming method of the invention as described above may be applied to flat panel displays such as liquid crystal displays (LCDs), field emission displays (FEDs), electrophoretic displays (EPDs), plasma display (PDPs), electro-chromic displays (ECDs), or electroluminescent displays (ELDs) so as to easily form electrodes or wirings with a good adhesion to a substrate and a desired resolution, and the present invention effectively works for all the cases using an electrically-conducting layer for the purpose of downsizing TFTs or increasing the performance of TFTs, or reducing the wiring resistance of liquid crystal displays.

The TFT wiring circuits of the invention is extremely useful when a formation of wet film processing for forming electrodes or wirings is requested in place of dry film processing, and when an enlarging of a display area is required. Active matrix type-displays which incorporates the TFT wiring circuit of the invention can be applied not only to flat panel displays but also to flat panel type-image sensors, and preferably used for various kinds of liquid crystal displays.

EXAMPLE

Hereinafter, the present invention will be descried in detail with reference to Examples, but it should be understood that the invention is not restricted to the Examples.

Examples and Comparative Examples Relating Utilization of Surface Charge Modifier Examples 1-1 to 1-4

Preparation of Substrate

The following composition having the following formulation was applied onto a surface of a polyimide film (KAPTON®, manufactured by Du Pont-Toray) that is used as a base material by using a coating bar of rod No. 18 and dried at 80° C. for 2 minutes so as to provide an intermediate layer having a thickness 6 μm.

The thus obtained base material having the intermediate layer was then pre-cured by being photoirradiated by using a 400 W high-pressure mercury lamp (trade name: UVL-400P, manufactured by Riko Kagaku Sangyo) for 10 minutes so as to prepare a substrate A used in Example 1-1.

The Rz of the base material, polyimide film, as determined by measuring the surface in the range of 40 μm×40 μm according to the above-described conventionally-known method and by using NANOPICS 1000 (trade name, manufactured by Seiko Instruments Inc.) was 15 nm. When the surface of substrate A having an intermediate layer formed on the polyimide film was also measured in a similar manner, the Rz was 10 nm, indicating that the surface unevenness of substrate A used in Example was within the preferable range of the invention.

Intermediate Layer Coating Solution

| | |
|---|---|
| Copolymer of allyl methacrylate/methacrylant (copolymerization molar ratio: 80/20, average molecular weight: 100,000) | 2 g |
| Ethylene oxide modified-bisphenol A diacrylate | 4 g |
| 1-Hydroxycyclohexylphenylketone | 1.6 g |
| 1-Methoxy-2-propanol | 16 g |

Preparation of Pattern-Forming Material

The pre-cured substrate A was immersed in an aqueous solution containing acrylic acid (10 by mass) and sodium periodate (NaIO$_4$, 0.01 by mass)), and exposed to light under an argon atmosphere for 30 minutes by using the 400 W high-pressure mercury lamp above. After photoirradiation, the film obtained was washed thoroughly with ion-exchange water, to provide a pattern-forming layer having grafted acrylic acids.

Separately, an aqueous solution containing 40 g of N-ethyl-N'-(3-dimethylaminopropyl)carbodiimide hydrochloride salt and 6 g of N-hydroxysuccinimide in 1 liter of water was prepared, and the acrylic acid-grafted substrate was immersed therein for 1 hour allowing ester exchange. Then, 6 g of 2-nitrobenzylphenol was added additionally thereto and allowed to react, to provide a pattern-forming material A having a pattern-forming layer of a polymer containing a photodegradable functional group.

Formation of Graft Pattern

Pattern-forming material A obtained was imagewise exposed by a laser (beam diameter: 1 μm) emitting a blue beam having a wavelength of 400 nm at an energy of 20 mJ/cm$^2$ so as to provide a graft pattern material 1-A.

The Rz of the patterned area of the graft pattern material 1-A having a graft layer on substrate A, as determined in a similar manner to the polyimide film base material, was 15 nm, indicating that the surface unevenness of the graft pattern material 1-A of Example 1-1 was within the preferable range of the invention.

Formation of Metallic Pattern

The graft pattern material 1-A was immersed in an aqueous 0.1% by mass palladium nitrate (manufactured by Wako Pure Chemical Industries) solution for 1 hour and then washed with distilled water. Subsequently, the graft pattern material 1-A was subjected to an electroless plating having the following formulation for 20 minutes so as to provide metallic patterns A1-1 to A1-4.

Components of Electroless Plating Bath

| | |
|---|---|
| OPC Copper H T1 (manufactured by Okuno Chemical Industries Co., Ltd.) | 6 mL |
| OPC Copper H T2 (manufactured by Okuno Chemical Industries Co., Ltd.) | 1.2 mL |
| OPC Copper H T3 (manufactured by Okuno Chemical Industries Co., Ltd.) | 10 mL |
| Surface charge modifier (compounds shown in Table 1) | Amount: described in Table 1 |
| Water | 83 mL |

TABLE 1

|  | Metallic pattern | Surface charge modifier | Addition amount |
|---|---|---|---|
| Example 1-1 | Metallic pattern A1-1 | Trimethyl-cetyl ammonium chloride | 5 ppm |
| Example 1-2 | Metallic pattern A1-2 | Diphenyl-hexyl-methyl ammonium-triflate | 25 ppm |
| Example 1-3 | Metallic pattern A1-3 | Compound P1 | 5 ppm |
| Example 1-4 | Metallic pattern A1-4 | Compound P1 | 20 ppm |
| Comparative example 1-1 | Metallic pattern A1-5 | none | none |

Comparative Example 1-1

Metallic pattern A1-5 was prepared in the same manner as Example 1-1, except that the surface charge modifier was not added to the electroless plating bath used in Examples 1-1 to 1-4.

Example 1-5 to 1-8

Preparation of Graft Pattern Material

Acrylic acid was applied on the surface of the substrate A prepared in a similar manner as Example 1-1 with a rod bar of #6, and the coated surface was laminated with a PET film having a thickness of 25 μm.

Further, after a chromium-deposited mask pattern having a pattern of a line length of 5 μm and a gap width of 25 μm and a pattern of line length of 10 μm and a gap width of 20 μm was placed thereon, the substrate A was exposed to UV light from above (400 W high-pressure mercury lamp: UVL-400P, manufactured by Riko Kagaku Sangyo Co., irradiation period: 30 seconds). After photoirradiation, the mask and the laminate film were removed, and the substrate was washed with water so as to provide a graft pattern material 1-B having polyacrylic acids grafted in the pattern form.

The Rz of the patterned area of the graft pattern material 1-B, as determined in a similar manner to the polyimide film base material, was 14 nm.
Formation of Metallic Pattern The graft pattern material 1-B was immersed in an aqueous solution containing 0.1% by mass of palladium nitrate (manufactured by Wako Pure Chemical Industries) for 1 hour and then washed with distilled water. The graft pattern material 1-B was further immersed in an aqueous solution of 0.2 M NaBH$_4$ for 20 minutes so that palladium imparted thereto is reduced to be zero-valent. Subsequently, the pattern material was immersed in an electroless plating bath having the same composition as used in Examples 1-1 to 1-4 for 20 minutes so as to provide metallic patterns B1-1 to B1-4.

Comparative Example 1-2

Metallic pattern B1-5 was prepared in the same manner as Example 1-5, except that the surface charge modifier was not added to the electroless plating bath used in Examples 1-5 to 1-8.

Examples 1-9 to 1-12

Preparation of Graft Pattern

A coating solution having the following composition was applied on the substrate A prepared in the same manner as Example 1-1 by using a rod bar of #18. A thickness of the thus obtained film was 0.8 μm.

Composition of Coating Solution
Hydrophilic polymer (preparation method thereof is shown below) 0.25 g
Water 5 g
Acetonitrile 3 g Preparation Method for the Hydrophilic Polymer 18 g of polyacrylic acid (average molecular weight: 25,000) was dissolved in 300 g of DMAc; 0.41 g of hydroquinone, 19.4 g of 2-methacryloyloxyethyl isocyanate, and 0.25 g of dibutyltin dilaurate were added thereto; and the mixture was allowed to react at 65° C. for 4 hours. The polymer thus obtained had an acid value of 7.02 meq/g. Thereafter, a carboxy group was neutralized with an aqueous solution of 1N sodium hydroxide. This was added to ethyl acetate, and polymer was precipitated followed by washing thoroughly, and hydrophilic polymer was obtained.

Further, after a chromium-deposited mask pattern having a pattern of a line length of 5 μm and a gap width of 25 μm and a pattern of line length of 10 μm and a gap width of 20 μm was placed thereon, the thus obtained film was subjected to a pattern exposure for 1 minute by using a 400 W high-pressure mercury lamp. The film obtained was then washed with water so as to provide a graft pattern material 1-C, in which the exposed portions became hydrophilic.

The Rz of the patterned area of the graft pattern material 1-C, as determined in a similar manner to the polyimide film base material, was 15 nm.
Formation of Metallic Pattern The graft pattern material 1-C obtained was immersed in an aqueous 0.1% by mass silver nitrate (manufactured by Wako Pure Chemical Industries) solution for 1 hour and then washed with distilled water. Subsequently, it was subjected to electroless plating in the same electroless plating bath as used in Examples 1-1 to 1-4 for 20 minutes so as to provide metallic patterns C1-1 to C1-4.

Comparative Example 1-3

Metallic pattern C1-5 was prepared in the same manner as Example 1-9, except that the surface charge modifier was not added to the electroless plating bath used in Examples 1-9 to 1-12.

Examples 1-13 to 1-16

The metallic patterns prepared in Examples 1-9 to 1-12 were further subjected to electroplating in an electroplating bath having the following composition for 15 minutes so as to provide metallic patterns D1-1 to D1-4.
Composition of Electroplating Bath

| Copper sulfate | 38 g |
| Sulfuric acid | 95 g |
| Hydrochloric acid | 1 mL |
| Brightener (trade name: COPPER GLEAM PCM, manufactured by Meltex Inc.) | 3 mL |
| Water | 500 g |

Examples 1-17 to 1-20

Preparation of Pattern-Forming Material

The substrate A prepared in a similar manner as in Example 1-1 was immersed in a t-butyl acrylate solution (30% by mass, solvent: propylene glycol monomethylether (MFG)), and exposed to light under an argon atmosphere by using a 400 W high-pressure mercury lamp for 30 minutes.

After photoirradiation, the film obtained was washed thoroughly with propylene glycol monomethylether (MFG) so as to provide a poly-t-butyl acrylate-grafted pattern-forming material 1-E.

Preparation of Graft Pattern Material

A solution having the following composition was applied on the metal (fine particle) film pattern-forming material 1-E. The thickness of the poly-t-butyl acrylate film obtained was 0.5 μm.

Triphenylsulfonium triflate 0.05 g
Methylethylketone (MEK) 1 g

Further, after a chromium-deposited mask pattern having a pattern of a line length of 5 μm and a gap width of 25 μm and a pattern of line length of 10 μm and a gap width of 20 μm was placed thereon, the thus obtained film was subjected to a pattern exposure by using a 400 W high-pressure mercury lamp for 1 minute and then heated at 90° C. for 2 minutes. The film obtained was then washed with methylethylketone (MEK) so as to provide a graft pattern material 1-E wherein the functional groups in the exposed area were converted to absorptive groups.

The Rz of the patterned area of graft pattern material 1-E, as determined in a similar manner to the polyimide film base material, was 15 nm.

Preparation of Metallic Pattern

The thus obtained graft pattern material 1-E was immersed in a dispersion containing positive charge-carrying Ag fine particles prepared by the following method for 1 hour and then washed with distilled water. Subsequently, it was subjected to electroless plating in the same electroless plating bath as that of Examples 1-1 to 1-4 for 20 minutes so as to provide metallic patterns E1-1 to E1-4.

Preparation Method of Positive Charge-Carrying Ag Fine Particles 3 g of bis(1,1-trimethylammoniumdecanoylaminoethyl) disulfide was added to 50 ml of an ethanol solution containing silver perchlorate (5 mm), and 30 ml of a sodium borohydride solution (0.4 M) was further added thereto dropwise while the solution was stirred vigorously so as to allow the ion to be reduced so as to provide a dispersion of silver fine particles coated with quaternary ammonium groups.

Comparative Example 1-4

Metallic pattern E1-5 was prepared in the same manner as Example 1-17, except that the surface charge modifier was not added to the electroless plating bath used in Examples 1-17 to 1-20.

Examples 1-21 to 1-24

A metallic pattern which is similar to that formed in Examples 1-17 to 1-20 were each further subjected to electroless Ni plating and then subjected to thin immersion gold plating so as to provide metallic patterns F1-1 to F1-4.

Electroless Nickel Plating

The metallic pattern was immersed in an electroless Ni—P plating solution (trade name: ICP NICORON USD, manufactured by OKUNO CHEMICAL INDUSTRIES CO., LTD.) at 85° C. under mechanical stirring for 10 minutes so that a 0.4 μm Ni—P (with a P content of 6.8%) film was deposited by the plating.

Thin Immersion Gold Plating

A immersion gold plating solution (trade name: OPC MUDEN GOLD AD, manufactured by OKUNO CHEMICAL INDUSTRIES CO., LTD.) was further used, in which the metallic pattern was immersed at 90° C. for 10 minutes without stirring so that about 0.05 μm gold was deposited. A cyan-free autocatalysis-type electroless gold plating solution (trade name: 509RS, manufactured by KANTO CHEMICAL CO., INC.) was further used, in which immersion was performed at 60° C. and a pH of 7.2 under gentle stirring for 30 minutes so that 0.5 μm gold was deposited and that a metallic pattern was obtained.

Evaluation

Measurement of Thin-Line Width of Metallic Pattern

The thin-line width of each of the metallic patterns obtained in Examples 1-1 to 1-24 and Comparative examples 1-1 to 1-4 were measured by using an optical microscope (trade name: OPTI PHOTO-2, manufactured by Nikon Corp.). Results of the measurement are summarized in the following Table 2.

Determination of the Thickness of Metallic Film

Each of the metallic patterns obtained in Examples 1-1 to 1-24 and Comparative examples 1-1 to 1-4 was cut in the direction perpendicular to the substrate surface by using a microtome, the thickness of the metallic film formed was determined by observing the cross section by SEM. The result of the measurement is an average of the thickness at three points per sample. Results of the measurement are summarized in the following Table 2. Evaluation of unevenness of interface between plating layer/plating catalyst layer and graft polymer layer Each of the metallic patterns obtained in Examples 1-1 to 1-24 and Comparative examples 1-1 to 1-4 was cut in the direction perpendicular to the substrate surface by using a microtome, the surface unevenness of the interface between the plated layer and plating catalyst layer (inorganic components) and the graft polymer layer (organic component) was determined by observing the cross section by SEM. The unevenness of the interface was obtained from the difference between an average value of the peak values from the maximum peak value to the fifth peak value and an average value of the bottom values from the minimum bottom value to the fifth bottom value in 1 μm width per sample. Results of the measurement are summarized in the following Table 2.

Evaluation of Adhesiveness

A copper plate (thickness: 0.1 mm) was adhered to the surface of each of the metallic patterns obtained in Examples 1-1 to 1-24 and Comparative examples 1-1 to 1-4 with an epoxy-based adhesive (trade name: ARALDITE, manufactured by Ciba-Geigy Corp.) and dried at 140° C. for 4 hours. Then, a 90-degree adhesion test was performed according to the 90-degree a conventionally-known test method of copper-clad laminates for printed wiring boards. Results of the measurement are summarized in the following Table 2.

TABLE 2

|  | Metallic pattern | Exposed area having 5 μm-thickness | | | Line width of Metallic pattern in Exposed area having 10 μm-thickness (μm) | Unevenness of interface of substrate | Adhesiveness (kN/m) |
|  |  | Line width of Metallic pattern (μm) | Thickness of metallic film (μm) | Aspect ratio |  |  |  |
| --- | --- | --- | --- | --- | --- | --- | --- |
| Example 1-1 | A1-1 | 6.0 | 5.8 | 0.96 | 11.4 | 100 μm or less | 0.32 |
| Example 1-2 | A1-2 | 5.8 | 5.6 | 0.96 | 12.6 | 100 μm or less | 0.30 |
| Example 1-3 | A1-3 | 5.7 | 5.9 | 1.04 | 12.4 | 100 μm or less | 0.32 |
| Example 1-4 | A1-4 | 5.4 | 5.6 | 1.04 | 12.3 | 100 μm or less | 0.31 |
| Comparative ex. 1-1 | A1-5 | 16.1 | 5.6 | 0.35 | 22.2 | 100 μm or less | 0.25 |
| Example 1-5 | B1-1 | 5.4 | 5.5 | 1.02 | 12.2 | 100 μm or less | 0.28 |
| Example 1-6 | B1-2 | 5.4 | 5.8 | 1.08 | 12.7 | 100 μm or less | 0.28 |
| Example 1-7 | B1-3 | 5.2 | 5.9 | 1.13 | 11.2 | 100 μm or less | 0.29 |
| Example 1-8 | B1-4 | 5.1 | 5.9 | 1.16 | 12.4 | 100 μm or less | 0.32 |
| Comparative ex. 1-2 | B1-5 | 10.3 | 5.8 | 0.56 | 17.7 | 100 μm or less | 0.28 |
| Example 1-9 | C1-2 | 5.5 | 5.9 | 1.08 | 11.4 | 100 μm or less | 0.29 |
| Example 1-10 | C1-3 | 5.1 | 5.9 | 1.14 | 12.9 | 100 μm or less | 0.28 |
| Example 1-11 | C1-4 | 5.2 | 5.8 | 1.12 | 12.8 | 100 μm or less | 0.31 |
| Example 1-12 | C1-5 | 5.1 | 5.7 | 1.12 | 11.3 | 100 μm or less | 0.31 |
| Comparative ex. 1-3 | C1-1 | 11.9 | 5.7 | 0.48 | 22.6 | 100 μm or less | 0.29 |
| Example 1-13 | D1-2 | 9.5 | 9.5 | 1 | 15.0 | 100 μm or less | 0.30 |
| Example 1-14 | D1-3 | 8.7 | 9.6 | 1.1 | 16.9 | 100 μm or less | 0.31 |
| Example 1-15 | D1-4 | 8.9 | 9.8 | 1.1 | 16.8 | 100 μm or less | 0.32 |
| Example 1-16 | D1-5 | 9.0 | 9.5 | 1.05 | 15.3 | 100 μm or less | 0.31 |
| Comparative ex. 1-4 | D1-1 | 15.7 | 10.4 | 0.66 | 26.5 | 100 μm or less | 0.32 |
| Example 1-17 | E1-2 | 5.4 | 5.6 | 1.03 | 11.5 | 100 μm or less | 0.30 |
| Example 1-18 | E1-3 | 5.9 | 5.6 | 0.96 | 11.4 | 100 μm or less | 0.28 |
| Example 1-19 | E1-4 | 5.8 | 5.7 | 0.68 | 13.0 | 100 μm or less | 0.30 |
| Example 1-20 | E1-5 | 5.5 | 5.7 | 1.05 | 12.5 | 100 μm or less | 0.32 |
| Comparative ex. 1-5 | E1-1 | 11.2 | 5.8 | 0.52 | 20.5 | 100 μm or less | 0.31 |
| Example 1-21 | F1-2 | 6.0 | 6.3 | 1.03 | 12.0 | 100 μm or less | 0.32 |
| Example 1-22 | F1-3 | 6.5 | 6.2 | 0.96 | 12.0 | 100 μm or less | 0.30 |
| Example 1-23 | F1-4 | 6.4 | 6.4 | 0.99 | 12.0 | 100 μm or less | 0.32 |
| Example 1-24 | F1-5 | 6.1 | 6.4 | 1.04 | 13.1 | 100 μm or less | 0.28 |
| Comparative ex. 1-6 | F1-1 | 11.8 | 6.4 | 0.54 | 21.2 | 100 μm or less | 0.29 |

Example 1-25

Preparation of Graft Pattern

Acrylic acid was applied on the surface of the substrate A prepared in a similar manner as Example 1-1 with a rod bar of #6, and the coated surface was laminated with a PET film having a thickness of 25 μm.

Further, after a chromium-deposited mask pattern having a pattern of a line length of 10 μm and a space of 10 μm was placed thereon, the substrate A was exposed to UV light from above (400 W high-pressure mercury lamp, trade name: UVL-400P, manufactured by Riko Kagaku Sangyo Co., irradiation period: 30 seconds). After photoirradiation, the mask and the laminate film were removed, and the substrate was washed with water so as to provide a graft pattern material 1-G having polyacrylic acids grafted in the pattern form. The thus obtained graft pattern was immersed in an aqueous solution containing 0.1 wt % of dye and observed (measured) by an optical microscope. It was found that the graft pattern reproduced the pattern with the line length of 10 μm and the space of 10 μm.

Formation of Metallic Pattern: Thin Copper Plating as Primary Plating

The graft pattern material 1-G was immersed in an aqueous solution containing 0.1% by mass of palladium nitrate (manufactured by Wako Pure Chemical Industries) for 1 hour and then washed with distilled water. The graft pattern material 1-G was further immersed in an aqueous solution of 0.2 M NaBH$_4$ for 20 minutes so that palladium imparted thereto is reduced to be zero-valent. Subsequently, the pattern material was immersed in an electroless plating bath having the same composition as used in Examples 1-1 to 1-4 for 20 minutes so as to provide metallic pattern G1-1. It was observed (measured) by SEM that the graft pattern had a line length of 11 μm, a space of 10 μm and a thickness of 1 μm.

Imparting Surface Potential to Portions Other than Copper Pattern

Synthesis of Polymer P1 Having Quaternary Ammonium Group 10 parts by weight of lauryl acrylate, 20 parts by weight of polyethylene glycol acrylate (trade name: AE-350, manufactured by Nippon Oil & Fats Co., Ltd., ethylene glycol chain length: 6 to 8), 40 parts by weight of dimethylaminoethyl acrylate, and 150 parts by weight of a solvent of tetrahydrofuran were added to a vessel equipped with a reflux condenser, a thermometer and a stirrer. A radical polymerization initiator (trade name: V-65, manufactured by Wako Pure Chemical Industries, Ltd.) was added thereto, and a polymerization reaction was performed for 10 hours under reflux of tetrahydrofuran. Subsequently, dimethyl sulfate, an amount thereof was equivalent to that of the dimethylaminoethyl acrylate in terms of mole, was added to the reaction system and further refluxed for 1 hour for conducting a quaternerization reaction. After the reaction was completed, the reaction solution was washed with hexane and subjected to reprecipitation to provide a compound P1. It is noted that the same compound P1 may be also provided by using a monomer produced by quaternarizing dimethylaminoethyl acrylate with dimethyl sulfate as a starting material. The resulting compound P1 was dissolved in a mixture solvent of ethanol and water (20:100 in weight ratio) to form a 0.5% by mass solution of the compound P1, which was assigned as a solution A2.

The thin copper pattern as described above was immersed in this solution for 5 minutes and then dried. As a result of measurement with a zeta potential meter (manufactured by Otsuka Electronics Co., Ltd.), the surface potential of the copper pattern part was +0.0 mV, while that of the portion other than the copper pattern was +30 mV.

Formation of Thick Copper Pattern as Secondary Plating

The substrate was electroless-plated for 30 minutes by the same method as for the thin plating so that a 10 µm thick pattern was obtained, which had a line width of 13 µm and a space of 7 µm, and thus it was found that the plating proceeded selectively in the thickness direction.

Comparative Example 1-5

Electroless plating was performed for 35 minutes in the same manner as in Example 1-25 except that the ammonium treatment was not performed. A 10 µm thick pattern was formed: however, the plating also proceeded to the portion of the space so that the pattern was completely degraded.

Observation of State of Dispersed Fine Particles in Polymer Layer with Metallic Pattern An area having the metallic film from the metallic pattern C obtained in Example 1-3 was cut with a diamond cutter (trade name: SUMI KNIFE, manufactured by Sumitomo Electric Hardmetal Corp.) equipped with a microtome (manufactured by Leica) such that a clean cross section of the plating was prepared. As a result of observing the thus obtained sample with an SEM, a dispersion state of fine particles was able to be found in the polymer adjacent to the metallic film. FIG. 1 is an SEM photograph of a cross section of the metallic pattern C obtained in Example 3. In FIG. 1, 10 designates the uneven portion of the interface of the plating (catalyst) layer and the graft polymer layer; 11 designates the electroplating layer; 12 denotes the electroless plating layer; and 13 designates the organic/inorganic hybrid layer.

It was confirmed from the photograph of FIG. 1 that the electroless plating catalyst and fine particles, which seem to be composed of at least one kind of metal deposited by means of the electroless plating, are present at high density in the polymer layer in the vicinity of the interface with the metallic film. Very few fine particles were observed at the deeper bottom part of the polymer layer (in the vicinity of the substrate).

The SEM photograph was then subjected to image processing with the software PHOTOSHOP® (manufactured by Adobe Systems Incorporated.) In the image processing, a part of the image showing areas at a depth of 0.1 µm, 0.2 µm or 0.3 µm from the interface between the polymer layer (the organic/inorganic hybrid layer in FIG. 1) and the metallic film (the electroless-plated layer) within a 6 µm-wide range was cut and converted to black and white (image processing) in which the image of the fine particle part was converted to white, while that of the polymer part black (black and white conversion conditions: a boundary threshold of 100). The resulting images are shown in FIG. 2.

In the image histograms, the proportion of the white part at each depth in FIG. 2 was calculated and defined as the content of the fine particles in the graft polymer layer existing under the lower part of the plated layer. As a result, the content of the fine particles in the area at a depth of 0.3 µm, 0.2 µm and 0.1 µm was calculated to be 53% by volume, 60% by volume and 60% by volume respectively, and it has been confirmed that the fine particles are present at high density in the vicinity of the interface with the metallic film.

Examples and Comparative Examples Relating Utilization of Plating Catalyst Poison Comparative Example 2-1

Formation of Metallic Pattern

The graft pattern material 1-A was immersed in an aqueous 0.1% by mass palladium nitrate (manufactured by Wako Pure Chemical Industries) solution for 1 hour and then washed with distilled water. Subsequently, the graft pattern material 1-A was subjected to an electroless plating having the following formulation for 20 minutes so as to provide a metallic pattern A2-1.

Components of Electroless Plating Bath
 OPC Copper H T1 (manufactured by Okuno Chemical Industries Co., Ltd.) 6 mL
 OPC Copper H T2 (manufactured by Okuno Chemical Industries Co., Ltd.) 1.2 mL
 OPC Copper H T3 (manufactured by Okuno Chemical Industries Co., Ltd.) 10 mL
 Water 83 mL Examples 2-1 to 2-4

Metallic patterns A2-2 to A2-4 were prepared in the same manner as in Comparative example 2-1, except that plating catalyst poisons as listed in the following Table 3 are further added so as to be respective concentrations as shown in Table 3.

TABLE 3

| | Metallic pattern | Plating catalyst poison | Concentration |
|---|---|---|---|
| Example 2-1 | Metallic pattern A2-2 | PbCl$_2$ | $2.5 \times 10^{-6}$ mol/L |
| Example 2-2 | Metallic pattern A2-3 | KI | $8 \times 10^{-5}$ mol/L |
| Example 2-3 | Metallic pattern A2-4 | 5-Mercapto-2-phenyltetrazole | $1 \times 10^{-6}$ mol/L |
| Example 2-4 | Metallic pattern A2-5 | 2-(2-mercaptobenzothiazolyl) sodium ethanesulfonate | $2.5 \times 10^{-6}$ mol/L |

Comparative examples 2-2 to 2-5

Metallic pattern A2-6 to A2-9 were prepared in the same manner as Comparative example 2-1, except that plating catalyst poisons as listed in the following Table 4 is further added so as to be respective concentrations as shown in Table 4.

TABLE 4

| | Metallic pattern | Plating catalyst poison | Concentration |
|---|---|---|---|
| Comparative example 2-2 | Metallic pattern A2-6 | PbCl$_2$ | $2.5 \times 10^{-4}$ mol/L |
| Example 2-3 | Metallic pattern A2-7 | KI | $4 \times 10^{-3}$ mol/L |
| Example 2-4 | Metallic pattern A2-8 | 5-Mercapto-2-phenyltetrazole | $2 \times 10^{-4}$ mol/L |
| Example 2-5 | Metallic pattern A2-9 | 2-(2-mercaptobenzothiazolyl) sodium ethanesulfonate | $5 \times 10^{-4}$ mol/L |

Comparative Example 2-6

Preparation of Graft Pattern Material

Acrylic acid was applied on the surface of the substrate A prepared in a similar manner as Example 2-1 with a rod bar of #6, and the coated surface was laminated with a PET film having a thickness of 25 μm.

Further, after a chromium-deposited mask pattern having a pattern of a line length of 5 μm and a gap width of 25 μm and a pattern of line length of 10 μm and a gap width of 20 μm was placed thereon, the substrate A was exposed to UV light from above (400 W high-pressure mercury lamp: UVL-400P, manufactured by Riko Kagaku Sangyo Co., irradiation period: 30 seconds). After photoirradiation, the mask and the laminate film were removed, and the substrate was washed with water so as to provide a graft pattern material 2-B having polyacrylic acids grafted in the pattern form.

The Rz of the patterned area of the graft pattern material 2-B, as determined in a similar manner to the polyimide film base material, was 14 nm.

Formation of Metallic Pattern

The graft pattern material 2-B was immersed in an aqueous solution containing 0.1% by mass of palladium nitrate (manufactured by Wako Pure Chemical Industries) for 1 hour and then washed with distilled water. The graft pattern material 1-B was further immersed in an aqueous solution of 0.2 M NaBH$_4$ for 20 minutes so that palladium imparted thereto is reduced to be zero-valent. Subsequently, the pattern material was immersed in an electroless plating bath having the same composition as used in Comparative example 2-1 for 20 minutes so as to provide a metallic pattern B2-1.

Examples 2-5 to 2-8

Metallic patterns B2-2 to B2-5 were prepared in the same manner as in Comparative example 2-6, except that plating catalyst poisons used in Examples 2-1 to 2-4 and listed in Table 3 were further added thereto so as to have similar concentrations thereof as shown in Table 3 respectively.

Comparative Example 2-7

A coating solution which is similar to the hydrophilic polymer-containing coating solution used in Examples 1-9 to 1-12 was coated onto a substrate A which was prepared in the same manner as in Example 2-1. The substrate was then subjected to a pattern exposure and wasing in the same manner as in Examples 1-9 to 1-12 so as to provide a graft pattern material 2-C, in which exposed portions was became hydrophilic. The Rz of the patterned area of the graft pattern material 2-C, as determined in a similar manner to the polyimide film base material, was 15 nm.

Formation of Metallic Pattern

The graft pattern material 2-C obtained was immersed in an aqueous 0.1% by mass silver nitrate (manufactured by Wako Pure Chemical Industries) solution for 1 hour and then washed with distilled water. Subsequently, it was subjected to electroless plating in the same electroless plating bath as used in Comparative example 2-1 for 20 minutes so as to provide a metallic pattern C2-2 to C2-5.

Comparative Example 2-8

The metallic pattern which is formed in the same manner as in Comparative example 2-7 was further subjected to electroplating for 15 minutes so as to provide a metallic pattern D2-1. The electroplating bath used therein has the same composition as that used in Examples 1-13 to 1-16.

Examples 2-13 to 2-16

The metallic pattern which is formed in the same manner as in Examples 2-9 to 2-12 were further subjected to electroplating for 15 minutes so as to provide metallic patterns D2-2 to D2-5.

Comparative Example 2-9

Preparation of Pattern-Forming Material

The substrate A prepared in a similar manner as in Example 2-1 was immersed in a t-butyl acrylate solution (30% by mass, solvent: propylene glycol monomethylether (MFG)), and exposed to light under an argon atmosphere by using a 400 W high-pressure mercury lamp for 30 minutes.

After photoirradiation, the film obtained was washed thoroughly with propylene glycol monomethylether (MFG) so as to provide a poly-t-butyl acrylate-grafted pattern forming material 2-E.

Preparation of Graft Pattern Material

A solution having the following composition was applied on the metal (fine particle) film pattern-forming material 2-E. The thickness of the poly-t-butyl acrylate film obtained was 0.5 μm.

Triphenylsulfonium triflate 0.05 g
Methylethylketone (MEK) 1 g

Further, after a chromium-deposited mask pattern having a pattern of a line length of 5 μm and a gap width of 25 μm and a pattern of line length of 10 μm and a gap width of 20 μm was placed thereon, the thus obtained film was subjected to a pattern exposure by using a 400 W high-pressure mercury lamp for 1 minute and then heated at 90° C. for 2 minutes. The film obtained was then washed with methylethylketone (MEK) so as to provide a graft pattern material 2-E wherein the functional groups in the exposed area were converted to absorptive groups.

The Rz of the patterned area of graft pattern material 2-E, as determined in a similar manner to the polyimide film base material, was 15 nm.

Preparation of Metallic Pattern

The thus obtained graft pattern material 2-E was immersed in a dispersion containing positive charge-carrying Ag fine particles prepared by the following method for 1 hour and then washed with distilled water. Subsequently, it was subjected to electroless plating in the same electroless plating bath as that of Comparative example 2-1 for 20 minutes so as to provide a metallic pattern E2-1.

Preparation Method of Positive Charge-Carrying Ag Fine Particles 3 g of bis(1,1-trimethylammoniumdecanoylaminoethyl) disulfide was added to 50 ml of an ethanol solution containing silver perchlorate (5 mm), and 30 ml of a sodium borohydride solution (0.4 M) was further added thereto dropwise while the solution was stirred vigorously so as to allow the ion to be reduced so as to provide a dispersion of silver fine particles coated with quaternary ammonium groups.

Examples 2-17 to 2-20

Metallic patterns E2-2 to E2-5 were prepared in the same manner as in Comparative example 2-9, except that plating catalyst poisons used in Examples 2-1 to 2-4 and listed in Table 3 were further added thereto so as to have similar concentrations thereof as shown in Table 3 respectively.

Comparative Example 2-10

A metallic pattern which is similar to that formed in Comparative example 2-9 was further subjected to electroless Ni plating and then subjected to thin immersion gold plating so as to provide a metallic pattern F2-1. The electroless Ni plating and thin immersion gold plating were conducted in the same conditions as those used in Examples 1-21 to 1-24.

Examples 2-21 to 2-24

Metallic patterns which are similar to that formed in Example 2-10 were each further subjected to electroless Ni plating and then subjected to thin immersion gold plating in the same manner as in Comparative example 2-10 so as to provide metallic patterns F2-2 to F2-5.

Evaluation

The thin-line width of each of the metallic patterns obtained in Examples 2-1 to 2-24 and Comparative examples 2-1 to 2-10 were measured in the same manner as for Examples 1-1 to 1-24 and Comparative examples 1-1 to 1-4. Results of the measurement are summarized in the following Tables 5 and 6.

TABLE 5

| | Metallic pattern | Exposed area having 5 μm-thickness | | | Line width of Metallic pattern in Exposed area having 10 μm-thickness (μm) | Unevenness of interface of substrate | Adhesiveness (kN/m) |
|---|---|---|---|---|---|---|---|
| | | Line width of Metallic pattern (μm) | Thickness of metallic film (μm) | Aspect ratio | | | |
| Comparative ex. 2-1 | A2-1 | 12.6 | 5.6 | 0.44 | 21.4 | 100 μm or less | 0.25 |
| Example 2-1 | A2-2 | 5.5 | 5.7 | 1.03 | 12.0 | 100 μm or less | 0.31 |
| Example 2-2 | A2-3 | 6.0 | 5.8 | 0.98 | 12.2 | 100 μm or less | 0.29 |
| Example 2-3 | A2-4 | 5.2 | 5.6 | 1.07 | 11.8 | 100 μm or less | 0.32 |
| Example 2-4 | A2-5 | 6.0 | 5.7 | 0.95 | 11.6 | 100 μm or less | 0.31 |
| Comparative ex. 2-2 | A2-6 | 5.8 | 2.7 | 0.46 | 11.0 | 100 μm or less | 0.30 |
| Comparative ex. 2-3 | A2-7 | 5.1 | 2.1 | 0.40 | 11.0 | 100 μm or less | 0.31 |
| Comparative ex. 2-4 | A2-8 | 6.6 | 3.3 | 0.50 | 11.7 | 100 μm or less | 0.28 |
| Comparative ex. 2-5 | A2-9 | 6.3 | 2.6 | 0.42 | 11.6 | 100 μm or less | 0.32 |
| Comparative ex. 2-6 | B2-1 | 16.2 | 5.5 | 0.34 | 16.5 | 100 μm or less | 0.31 |
| Example 2-5 | B2-2 | 5.9 | 5.6 | 0.94 | 11.5 | 100 μm or less | 0.32 |
| Example 2-6 | B2-3 | 5.8 | 6.0 | 1.02 | 12.6 | 100 μm or less | 0.32 |
| Example 2-7 | B2-4 | 5.0 | 5.6 | 1.12 | 11.1 | 100 μm or less | 0.31 |
| Example 2-8 | B2-5 | 5.9 | 5.7 | 0.97 | 12.4 | 100 μm or less | 0.31 |
| Comparative ex. 2-7 | C2-1 | 16.9 | 5.5 | 0.33 | 22.3 | 100 μm or less | 0.29 |
| Example 2-9 | C2-2 | 5.6 | 5.8 | 1.04 | 12.1 | 100 μm or less | 0.32 |
| Example 2-10 | C2-3 | 5.4 | 5.7 | 1.06 | 11.5 | 100 μm or less | 0.32 |
| Example 2-11 | C2-4 | 5.8 | 5.9 | 1.02 | 12.7 | 100 μm or less | 0.29 |
| Example 2-12 | C2-5 | 5.8 | 5.7 | 0.98 | 12.9 | 100 μm or less | 0.28 |

TABLE 6

| | Metallic pattern | Exposed area having 5 μm-thickness | | | Line width of Metallic pattern in Exposed area having 10 μm-thickness (μm) | Unevenness of interface of substrate | Adhesiveness (kN/m) |
|---|---|---|---|---|---|---|---|
| | | Line width of Metallic pattern (μm) | Thickness of metallic film (μm) | Aspect ratio | | | |
| Comparative ex. 2-8 | D2-1 | 13.5 | 11.0 | 0.81 | 19.2 | 100 μm or less | 0.31 |
| Example 2-13 | D2-2 | 9.0 | 9.4 | 1.05 | 16.1 | 100 μm or less | 0.28 |
| Example 2-14 | D2-3 | 9.4 | 9.6 | 1.02 | 16.8 | 100 μm or less | 0.31 |
| Example 2-15 | D2-4 | 9.1 | 9.1 | 0.99 | 15.5 | 100 μm or less | 0.28 |
| Example 2-16 | D2-5 | 9.5 | 9.3 | 0.98 | 16.6 | 100 μm or less | 0.32 |
| Comparative ex. 2-9 | E2-1 | 12.6 | 6.0 | 0.48 | 22.1 | 100 μm or less | 0.29 |
| Example 2-17 | E2-2 | 5.8 | 5.8 | 1.00 | 11.8 | 100 μm or less | 0.29 |
| Example 2-18 | E2-3 | 5.1 | 5.9 | 1.17 | 12.9 | 100 μm or less | 0.32 |
| Example 2-19 | E2-4 | 5.4 | 5.9 | 1.09 | 12.8 | 100 μm or less | 0.29 |
| Example 2-20 | E2-5 | 5.6 | 5.7 | 1.02 | 12.9 | 100 μm or less | 0.30 |
| Comparative ex. 2-10 | F2-1 | 12.7 | 6.4 | 0.50 | 19.8 | 100 μm or less | 0.28 |
| Example 2-21 | F2-2 | 5.6 | 6.4 | 1.15 | 12.3 | 100 μm or less | 0.28 |

TABLE 6-continued

| | Metallic pattern | Line width of Metallic pattern (μm) | Thickness of metallic film (μm) | Aspect ratio | Line width of Metallic pattern in Exposed area having 10 μm-thickness (μm) | Unevenness of interface of substrate | Adhesiveness (kN/m) |
|---|---|---|---|---|---|---|---|
| | | Exposed area having 5 μm-thickness | | | | | |
| Example 2-22 | F2-3 | 6.2 | 6.2 | 1.00 | 12.7 | 100 μm or less | 0.30 |
| Example 2-23 | F2-4 | 6.2 | 6.2 | 1.00 | 12.0 | 100 μm or less | 0.30 |
| Example 2-24 | F2-5 | 6.2 | 6.2 | 1.02 | 11.8 | 100 μm or less | 0.28 |

The results of Tables 3, 5 and 6 show that all of the metallic patterns obtained in the examples according to the invention respectively has a fine line with a width of at most 10 μm, which would otherwise be difficult to obtain by conventional techniques. It has also been demonstrated that the fine line width can be controlled by the graft pattern-forming method and the light exposure conditions.

It has also been found that all of the metallic patterns obtained in the examples according to the invention respectively has a thickness of copper which is sufficient to provide conductivity. Little growing of a line width of the fine line was observed relative to a line width of an exposed pattern, and metallic patterns having excellent reproducibility of fine lines of exposed patterns were obtained. It has also been found that a metallic pattern having a ratio of a thickness of a metallic film thereof to a line width of a metallic film thereof is 1 or more can be obtained, while such a metallic pattern could have not been easily obtained by conventional method.

It has also been found that even if the plating catalyst poison is added, excessively high concentrations of the catalyst poison in the plating solution (as in Comparative Examples 2-2 to 2-5) cause a significant inhibition of the plating and a significant reduction in the plating rate so that the advantageous effect of the invention cannot be achieved.

In Examples 1-9 to 1-12 and 2-13 to 2-16, it has been demonstrated that patterned metallic films with desired thicknesses are obtained by further performing electroplating.

It has also been found that all the metallic patterns obtained in the examples according to the invention each have film interface irregularities of 100 μm or less and thus good surface smoothness and also have good adhesion between the substrate and the metallic film.

Further, all of the metallic patterns and conductive films obtained in the Examples according to the invention were formed on a substrate surface having an unevenness Rz of 500 nm or less and the graft layer or graft pattern are formed on the substrate. As a result, the unevenness Rz of the graft layer or graft pattern surface became 500 nm or less; all of the metallic films or metallic patterns formed in the pattern by plating had an unevenness of the interface between the plating layer (metallic film) and plating catalyst layer and the graft polymer layer (organic material component) in the preferable range of 500 nm or less. At this point, a plating metal or a plating catalyst are hybridized by entering not only the surface of a graft polymer layer but the inside of the graft polymer layer. Due to this hybridization, an interface between a plating layer (metallic film) and a plating catalyst layer (inorganic material component) and a graft polymer layer (organic material component) has excellent surface smoothness, and also has excellent adhesiveness between a substrate and a metallic film.

The disclosures of Japanese Patent Application Nos. 2005-323221 and 2005-40610 are incorporated herein by reference in their entireties.

All publications, patent applications, and technical standards mentioned in this specification are herein incorporated by reference to the same extent as if each individual publication, patent application, or technical standard was specifically and individually indicated to be incorporated by reference.

The invention claimed is:
1. A method of forming a metallic pattern comprising:
(a) forming, in a pattern form on a substrate, a polymer layer which contains a polymer that has a functional group that interacts with an electroless plating catalyst or a precursor thereof and is capable of chemically bonding directly to the substrate, at least a part of the polymer layer being chemically bonded directly to the substrate;
(b) imparting the electroless plating catalyst or precursor thereof onto the polymer layer; and
(c) forming a metallic film in the pattern form by subjecting the substrate having the polymer layer to electroless plating using an electroless plating solution,
wherein the substrate having the polymer layer imparted with the electroless plating catalyst or precursor thereof is treated using a solution comprising a surface charge modifier or $1\times10^{-10}$ to $1\times10^{-4}$ mmol/l of a plating catalyst poison before or during the (c) forming of the metallic film, and
wherein the electroless plating solution comprises the surface charge modifier, the surface charge modifier being selected from the group consisting of a compound represented by following Formula (C-1):

Formula (C-1)

wherein, in Formula (C-1), $R^1$ to $R^4$ each independently represents a monovalent organic group, and $X^-$ represents a counter anion; copolymers produced by copolymerizing a monomer having a quaternary ammonium salt group, a monomer having an ethylene glycol chain, and a monomer having a hydrocarbon having 4 or more carbon atoms; and copolymers produced by copolymerizing a monomer having an amine group, a monomer having an ethylene glycol chain, and a monomer having a hydrocarbon having 4 or more carbon atoms and quaternarizing the resulting copolymer.

2. The metallic pattern forming method according to claim 1, wherein the (c) forming of the metallic film comprises:
(c-2) treating the substrate having the polymer layer with a bath containing the surface charge modifier; and
(c-3) subjecting the substrate having the polymer layer to electroless plating so as to form the metallic film in the pattern form.

3. The metallic pattern forming method according to claim 1, wherein the electroless plating solution comprises the $1\times10^{-10}$ to $1\times10^{-4}$ mmol/l of the plating catalyst poison.

4. The metallic pattern forming method according to claim 1, wherein the (c) forming of the metallic film comprises
(c-2') subjecting the substrate having the polymer layer to electroless plating while adding the plating catalyst poison to the electroless plating solution so that a concentration of the plating catalyst poison in the electroless plating solution is maintained in a range of $1\times10^{-10}$ to $1\times10^{-4}$ mmol/l so as to form the metallic film in the pattern form.

5. The metallic pattern forming method according to claim 3, wherein the plating catalyst poison is an ion of a metal which is selected from the group consisting of Pb, Sn, As, Sb, Bi, Cr, Mo, Cd, In, Tl, W, Nb, and Ti.

6. The metallic pattern forming method according to claim 3, wherein the plating catalyst poison is an inorganic anion selected from the group consisting of an iodine anion, a bromine anion, and a sulfide anion.

7. The metallic pattern forming method according to claim 3, wherein the plating catalyst poison is an organic compound having, in its molecule, a group having an affinity for a plating metal.

8. The metallic pattern forming method according to claim 7, wherein the plating catalyst poison further has an ionic leaving group in its molecule.

9. The metallic pattern forming method according to claim 1, wherein the electroless plating solution in the electroless plating is selected from the group consisting of an electroless copper plating solution, an electroless silver plating solution and an electroless gold plating solution.

10. The metallic pattern forming method according to claim 1, which further comprises carrying out electroplating after the electroless plating.

11. The metallic pattern forming method according to claim 1, wherein:
the substrate has a surface unevenness of 500 nm or less;
an adhesiveness between the substrate and the metallic film is 0.2 kN/m or more; and
at least one of the following conditions (1) to (3) is satisfied:
(1) a thickness of the metallic film is 3 μm or more; and
the relation (q−p)<r is satisfied, wherein p represents a line width of the pattern layer in the pattern form, q represents a line width of the metallic film formed by the electroless plating, and r represents a thickness of the metallic film formed by the electroless plating;
(2) the polymer layer has a region having dispersed therein fine particles comprising at least one of electroless plating catalyst particles and metal particles deposited by the electroless plating, in a content of 25% by volume or more, the region extending 0.05 μm or more from the interface of the polymer layer and the metallic film in a direction toward the substrate; and
a ratio of a thickness of the metallic film to a line width of the metallic film is 1 or more;
(3) a thickness of the metallic film is 3 μm or more;
the polymer layer has a region having dispersed therein fine particles comprising at least one of electroless plating catalyst particles and metal particles deposited by the electroless plating, in a content of 25% by volume or more, the region extending 0.05 μm or more from the interface of the polymer layer and the metallic film in a direction toward the substrate; and
a ratio of a thickness of the metallic film to a line width of the metallic film is 1 or more.

12. The metallic pattern forming method according to claim 11, wherein the substrate has a surface unevenness of 100 nm or less.

13. The metallic pattern forming method according to claim 4, wherein the plating catalyst poison is an ion of a metal which is selected from the group consisting of Pb, Sn, As, Sb, Bi, Cr, Mo, Cd, In, Tl, W, Nb, and Ti.

14. The metallic pattern forming method according to claim 4, wherein the plating catalyst poison is an inorganic anion selected from the group consisting of an iodine anion, a bromine anion, and a sulfide anion.

15. The metallic pattern forming method according to claim 4, wherein the plating catalyst poison is an organic compound having, in its molecule, a group having an affinity for a plating metal.

16. The metallic pattern forming method according to claim 15, wherein the plating catalyst poison further has an ionic leaving group in its molecule.

17. The method of claim 1 wherein the surface charge modifier is absorbed into a substrate and inhibits metal ion absorption into the substrate, and electroless plating solution is provided to the polymer layer having the pattern formed therein.

18. The method of claim 1 wherein the monomer having a quaternary ammonium salt group is a monomer represented by following Formula (C-2):

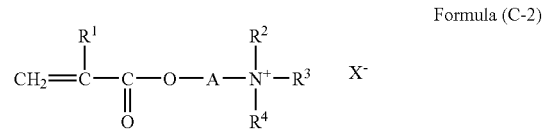

Formula (C-2)

wherein, in Formula (C-2), $R^1$ represents a hydrogen atom or —$CH_3$; $R^2$ and $R^3$ each independently represents a hydrogen atom, an alkyl group having 1 to 4 carbon atoms, or a hydroxyalkyl group having 1 to 4 carbon atoms; $R^4$ represents an alkyl group of 1 to 20 carbon atoms, a hydroxyalkyl group having 1 to 10 carbon atoms, or an aralkyl group having 1 to 10 carbon atoms; A represents an alkylene or oxyalkylene group having 1 to 10 carbon atoms or a polyoxyalkylene group having 1 to 10 carbon atoms; and $X^-$ represents a counter anion.

* * * * *